(12) United States Patent
Arumugam et al.

(10) Patent No.: US 11,955,444 B2
(45) Date of Patent: Apr. 9, 2024

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Manikandan Arumugam, Tainan (TW); Tsung-Yi Yang, Tainan (TW); Chien-Chih Chen, Tainan (TW); Mu-Han Cheng, Tainan (TW); Kuo-Hsien Cheng, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 254 days.

(21) Appl. No.: 17/450,780

(22) Filed: Oct. 13, 2021

(65) Prior Publication Data

US 2022/0293541 A1    Sep. 15, 2022

Related U.S. Application Data

(60) Provisional application No. 63/160,662, filed on Mar. 12, 2021.

(51) Int. Cl.
*H01L 23/48* (2006.01)
*H01L 23/00* (2006.01)
(Continued)

(52) U.S. Cl.
CPC .............. *H01L 24/08* (2013.01); *H01L 24/03* (2013.01); *H01L 24/05* (2013.01); *H01L 24/80* (2013.01);
(Continued)

(58) Field of Classification Search
CPC ......... H01L 24/08; H01L 24/03; H01L 24/05; H01L 24/80; H01L 2224/0345; H01L 2224/03616; H01L 2224/05026; H01L 2224/0508; H01L 2224/05147; H01L 2224/035193; H01L 2224/08145; H01L 2224/80895; H01L 23/5226; H01L 25/0657; H01L 2224/0401; H01L 2224/16225; H01L 24/16;
(Continued)

(56) References Cited

U.S. PATENT DOCUMENTS

2018/0033749 A1* 2/2018 Chen ..................... H01L 24/02

FOREIGN PATENT DOCUMENTS

CN     111801793 A  * 10/2020 ............. H01L 24/03

* cited by examiner

*Primary Examiner* — Niki H Nguyen
(74) *Attorney, Agent, or Firm* — Harrity & Harrity, LLP

(57) ABSTRACT

Some implementations described herein provide a semiconductor structure. The semiconductor structure includes a first conductive structure disposed within a first layer of the semiconductor structure. The semiconductor structure includes a dielectric structure disposed within a second layer of the semiconductor structure, with the second layer being disposed on the first layer. The semiconductor structure includes a second conductive structure disposed within a recessed portion of the dielectric structure that extends to the first conductive structure, with the second conductive structure having a concave recessed portion on a top surface of the second conductive structure. The semiconductor structure includes multiple layers of conductive material disposed within the concave recessed portion of the second conductive structure.

20 Claims, 23 Drawing Sheets

(51) Int. Cl.
*H01L 23/52* (2006.01)
*H01L 29/40* (2006.01)

(52) U.S. Cl.
CPC ............... *H01L 2224/0345* (2013.01); *H01L 2224/03616* (2013.01); *H01L 2224/05026* (2013.01); *H01L 2224/0508* (2013.01); *H01L 2224/05147* (2013.01); *H01L 2224/05193* (2013.01); *H01L 2224/08145* (2013.01); *H01L 2224/80895* (2013.01); *H01L 2224/80896* (2013.01)

(58) Field of Classification Search
CPC ..... H01L 2224/32225; H01L 21/76898; H01L 2224/73204; H01L 2224/05647; H01L 21/76805; H01L 2224/12105; H01L 23/53238; H01L 21/76895; H01L 29/41791; H01L 21/76816; H01L 2224/16227; H01L 2224/32145; H01L 33/62; H01L 21/76883; H01L 23/53295; H01L 2224/80896; H01L 2924/01006; H01L 21/76879; H01L 2224/73265; H01L 24/97; H01L 2924/01078; H01L 2224/05655; H01L 2224/48227; H01L 2924/01033; H01L 21/3212; H01L 2224/05624; H01L 24/92; H01L 2924/01074; H01L 21/76849; H01L 2224/13144; H01L 21/56; H01L 21/76885; H01L 23/5329; H01L 2224/11; H01L 24/94; H01L 24/48; H01L 21/76846; H01L 21/823871

See application file for complete search history.

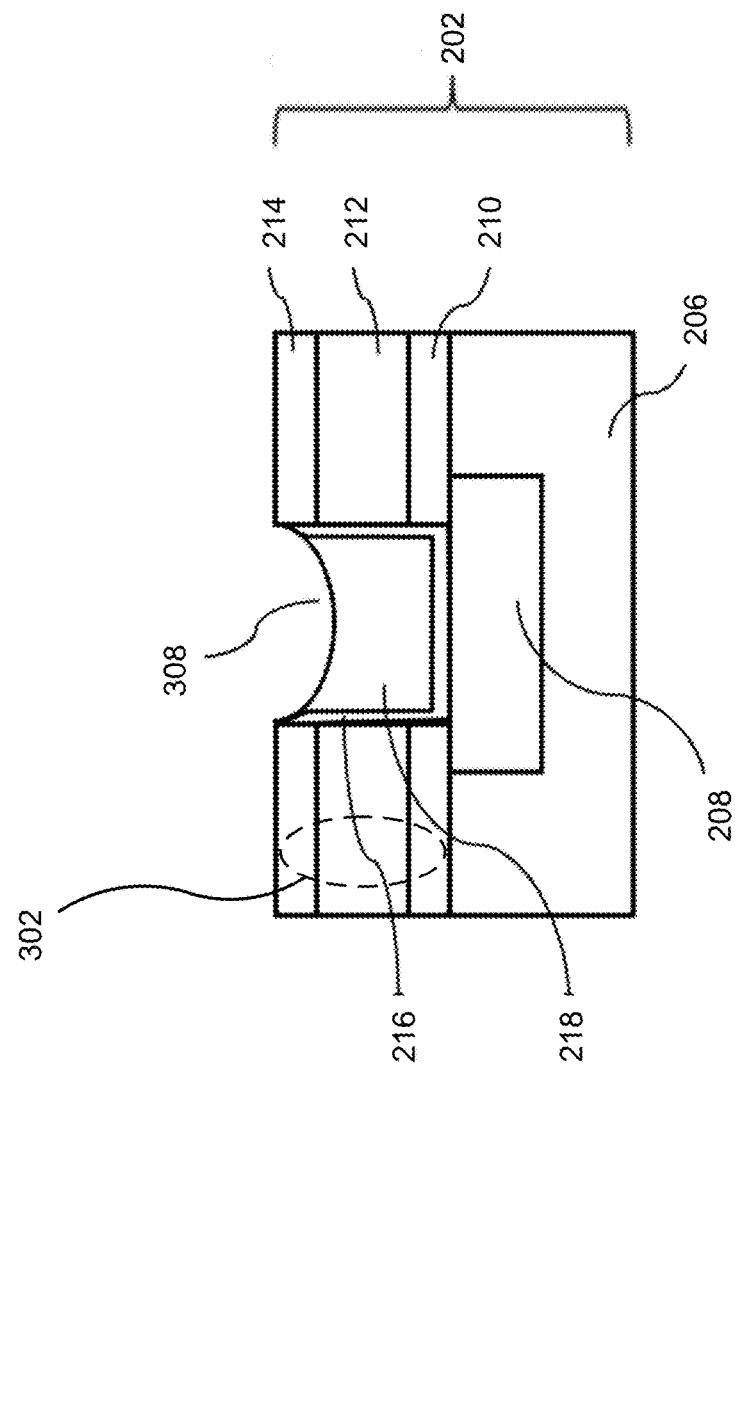

SEMICONDUCTOR STRUCTURE AND MANUFACTURING METHOD THEREOF

CROSS-REFERENCE TO RELATED APPLICATION

This Patent Application claims priority to U.S. Provisional Patent Application No. 63/160,662, filed on Mar. 12, 2021, and entitled "SURFACE PLANARIZATION FOR HYBRID BONDING." The disclosure of the prior Application is considered part of and is incorporated by reference into this Patent Application.

BACKGROUND

A semiconductor structure and/or a wafer may be planarized using a polishing or planarizing technique such as chemical mechanical polishing/planarization (CMP) process. A CMP process may include depositing a slurry (or polishing compound) onto a polishing pad. A wafer may be mounted to a carrier, which may rotate the wafer as the wafer is pressed against the polishing pad. The slurry and polishing pad act as an abrasive that polishes or planarizes one or more layers of the wafer as the wafer is rotated. The polishing pad may also be rotated to ensure a continuous supply of slurry is applied to the polishing pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3H are diagrams of an example implementation of forming a semiconductor structure described herein.

DETAILED DESCRIPTION

Figure 1:
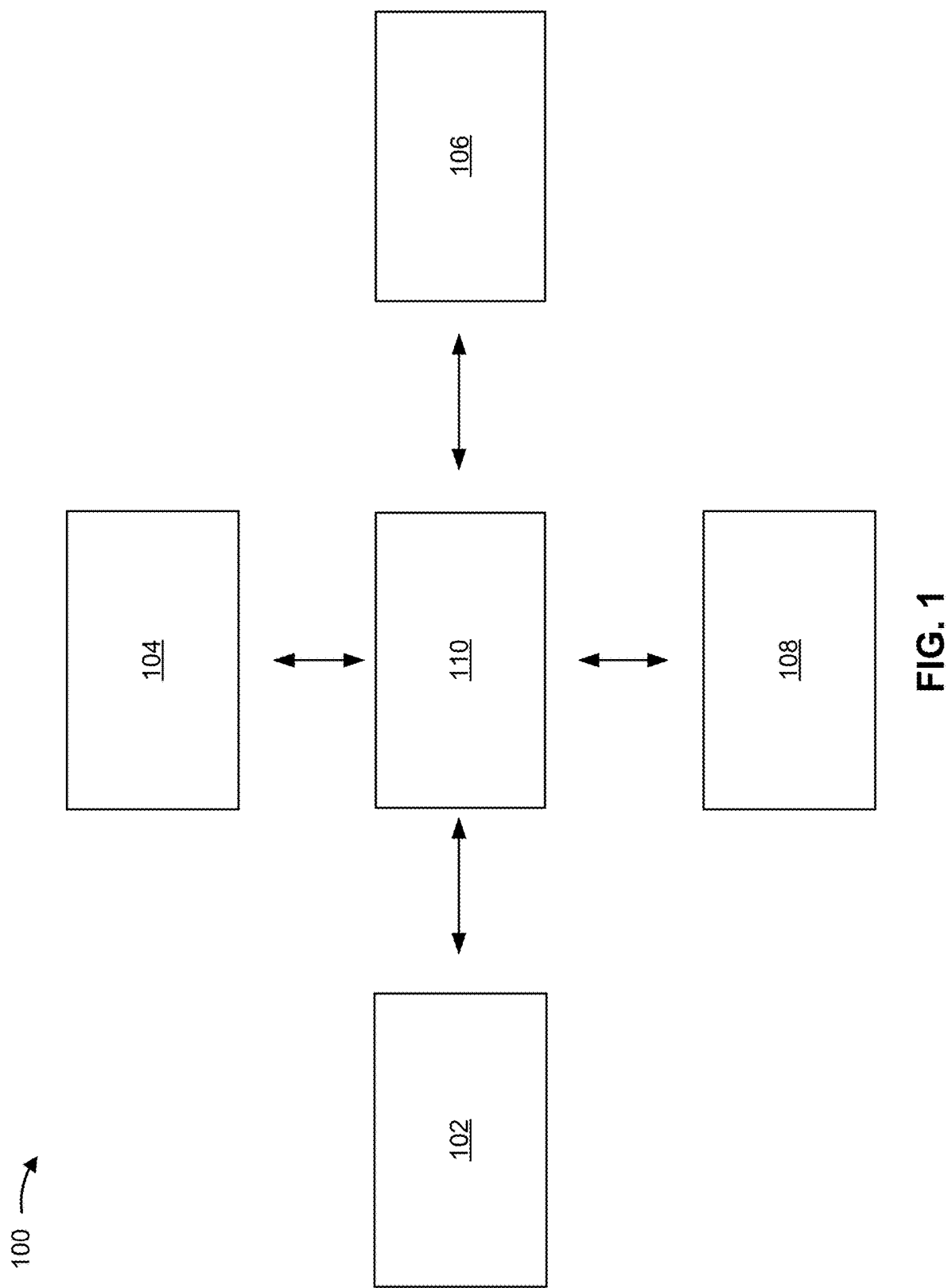
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "below," "bottom," "above," "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Wafer-on-Wafer stacking or hybrid bonding (BB) is considered as a solution for performance improvement of complementary metal-oxide-semiconductor (CMOS) technology among other bonding technologies such as anodic, thermocompression, glass frit, adhesive, fusion, and surface-activated bonding technologies. Bonding interfaces of wafers that are to be bonded may impact whether a hybrid bond is robust and successful. For example, a surface of a first wafer that is to be bonded with a surface of a second wafer should be generally planar (e.g., flat) to interface with the surface of the second wafer, which should also be generally planar, to facilitate a structurally strong bond and improved electrical coupling.

To flatten a surface of a wafer, a chemical mechanical polishing (CMP) tool may polish the surface using a combination of chemical and mechanical components. However, a CMP tool may cause dishing (e.g., a concave recession) in a metal portion of the surface, with an amount of dishing dependent on a material of the surface. For example, a copper portion of the surface may suffer from more dishing than a dielectric portion (e.g., multiple nanometers of recession). A dielectric portion of the surface may suffer from dielectric erosion after the CMP process. The dishing and/or the dielectric erosion may cause the wafer to be unsuitable for hybrid bonding based on forming a poor electrical connection with a metal portion of an additional wafer and/or a poor structural bond with the additional wafer, among other examples.

Some implementations described herein provide techniques and apparatuses for forming a semiconductor structure having improved planarization (e.g., improved flattening and/or improved uniformity of height, among other examples). The semiconductor structure may include a wafer, with a surface having improved planarization, to be used for hybrid bonding. To improve planarization, one or more semiconductor processing tools may reduce dishing and/or dielectric erosion effects in the surface to be used for hybrid bonding. In some implementations, the one or more semiconductor processing tools may reduce dishing and/or dielectric erosion effects based on growing (e.g., via nucleation) conductive materials to fill dishing voids and/or using nitrogen plasma to fill voids from dielectric erosion effects.

In this way, the one or more semiconductor processing tools may provide an improved planarization on a top surface of the semiconductor structure, which may form a uniform bonding interface (e.g., with reduced, or no, metal dishing or dielectric erosion). Additionally, or alternatively, a manufacturing process may omit a post bonding annealing process based on providing a smooth bonding surface and a covalent bond at the bonding interface, which may enhance a bonding strength. The improved planarization may increase mechanical strength at the bonding interface to enable multi-wafer stacking without, or with reduced, formation of voids or delamination. The increase mechanical strength may improve resistance to mechanical stress induced by a wafer thinning process (e.g., an additional CMP process), protect metal at the bonding interface from degradation, avoid formation of relatively large metal grains at the bonding interface which may cause a reduction of metal interdiffusion, and/or enhance a surface purity (e.g., based on removing metal oxide residuals after a post CMP cleaning process by using a plasma-enhanced chemical vapor deposition (PECVD) process), among other examples. Further, the improved planarization may reduce, or eliminate, metal oxide formation, improve a conductivity of the metal at the bonding interface, and/or avoid metal atom migration into a dielectric layer caused by misaligned bonding of metal at the bonding interface. Additionally, the semiconductor structure may be formed with a reduced pitch length based on reducing cross talk between the metal at the bonding surfaces for adjacent devices of the semiconductor structure.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a planarization tool 106, a bonding tool 108, and/or another semiconductor processing tool. The tools included in the example environment 100 may be included in a semiconductor clean room, a semiconductor foundry, a semiconductor processing and/or manufacturing facility, or another location.

Deposition tool 102 is a semiconductor processing tool that is capable of depositing various types of materials onto a substrate. In some implementations, deposition tool 102 includes a spin coating tool that is capable of depositing a photoresist layer on a substrate such as a wafer. In some implementations, deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, a deposition tool 102 includes a physical vapor deposition (PVD) tool, such as a sputtering tool or another type of PVD tool. In some implementations, the example environment 100 includes a plurality of types of deposition tools 102.

Etching tool 104 is a semiconductor processing tool that is capable of etching various types of materials of a substrate, wafer, or semiconductor device. For example, etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of the substrate using a sputtering technique, a plasma-assisted etch technique (e.g., a plasma sputtering technique or another type of technique involving the use of an ionized gas to isotropically or directionally etch the one or more portions), or another type of dry etching technique.

Planarization tool 106 is a semiconductor processing tool that is capable of polishing or planarizing various layers of a wafer or semiconductor device. For example, planarization tool 106 may include a CMP tool and/or another type of planarization tool that polishes or planarizes a layer or surface of deposited or plated material. Planarization tool 106 may polish or planarize a surface of a semiconductor device with a combination of chemical and mechanical forces (e.g., chemical etching and free abrasive polishing). Planarization tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar. The planarization tool 106 may further include a grinder, a trimmer, or another tool that may be used to polish and/or planarize a layer or surface of deposited or plated material.

The bonding tool 108 is a semiconductor processing tool that is capable of bonding two or more wafers (or two or more semiconductor substrates, or two or more semiconductor structures) together using copper-to-copper bonding, fusion bonding, and/or thermocompression bonding, among other examples. For example, the bonding tool 108 may include a eutectic bonding tool that is capable of forming a eutectic bond between two or more wafers. In these examples, the bonding tool 108 may heat the two or more wafers to form a eutectic system between the materials of the two or more wafers. In some examples, the bonding tool 108 may position the two or more wafers to facilitate chemical bonding (e.g., forming covalent bonds) and/or the bonding tool 108 may bond the two or more wafers without external heat.

Wafer/die transport tool 110 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-108 and/or to and from other locations such as a wafer rack, a storage room, or another location. In some implementations, wafer/die transport tool 110 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
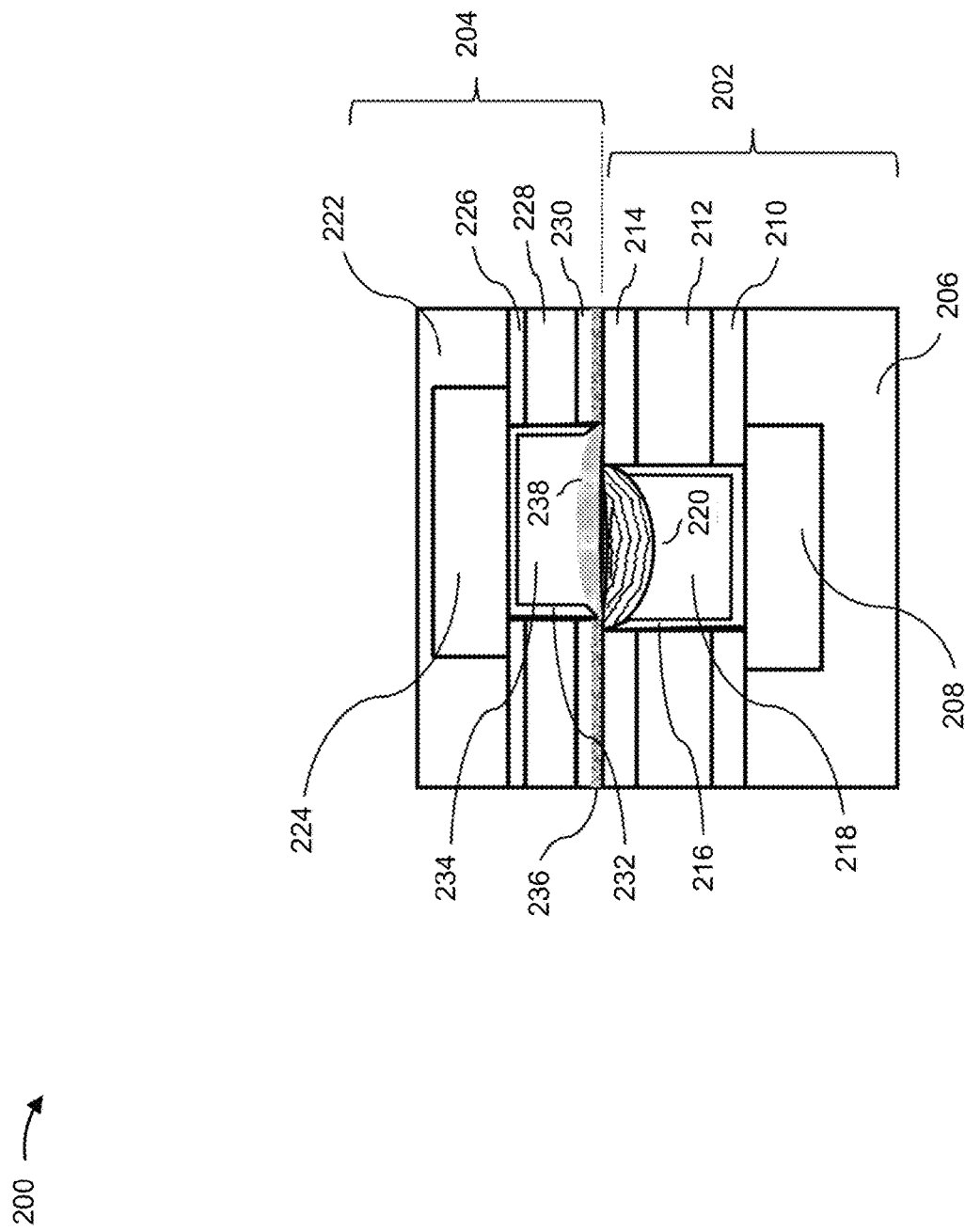
FIG. 2 is a diagram of an example semiconductor structure described herein.

FIG. 2 is a diagram of an example semiconductor structure 200 described herein. In some implementations, the semiconductor structure 200 may include one or more layers not shown in FIG. 2, such as one or more barrier layers, adhesion layers, metal gates, substrates, interconnects, recesses (e.g., vias), or semiconductor structures, among other examples. In some implementations, the semiconductor structure 200 may include, or may be included within, a complementary metal-oxide-semiconductor (CMOS) image sensor (CIS), a 3-dimensional integrated circuit (IC), or a 3-dimensional resistive random access memory device (3D RRAM), among other examples.

As shown in FIG. 2, the semiconductor structure 200 may include a first wafer 202 and a second wafer 204. The first wafer 202 and the second wafer 204 are bonded at a bonding interface to form a multi-wafer stack.

The first wafer 202 includes a substrate 206 (e.g., a dielectric structure and/or a silicon-based structure) having a conductive structure 208 (e.g., a metal structure and/or a top metal) disposed within a recessed portion of the substrate 206. The substrate 206 and the conductive structure 208 may be included in a first layer of the first wafer 202.

The first wafer 202 includes a dielectric structure disposed on a top surface of the substrate 206 and the conductive structure 208. The dielectric structure may include a barrier layer 210, a redistribution oxide layer 212, and/or a bonding dielectric layer 214. The barrier layer 210 may reduce electromigration from the conductive structure 208 into the dielectric structure. In some implementations, the barrier layer 210 facilitates scaling down a thickness of the bonding dielectric layer 214 based on, for example, a reduction of electromigration to the bonding dielectric layer 214 that may otherwise deteriorate the bonding dielectric layer 214. The barrier layer 210 may include silicon nitride, silicon dioxide, or dielectric 2-dimensional layers, among other examples. The redistribution oxide layer 212 may include silicon dioxide, silicon oxycarbide, or high density plasma oxygen, among other examples. The bonding dielectric layer 214 (e.g., an oxide-based material or a nitride-based material) may be configured to bond the first wafer 202 and the second wafer 204 based on one or more materials of the first wafer 202 and the second wafer 204 at the bonding interface. In some implementations, the bonding dielectric layer 214 includes silicon oxynitride, silicon dioxide, silicon oxycarbide, silicon carbon nitride, or a hybrid dielectric, among other examples. The bonding dielectric layer 214 may include a heterostructure having nitrogen and/or hydrogen dopants. The dielectric structure includes a recessed portion that extends from a top surface of the dielectric structure (e.g., a top surface of the bonding dielectric layer 214) to the conductive structure 208.

In some implementations, the first wafer 202 includes a diffusion barrier layer 216 disposed within the recessed portion of the dielectric structure. The diffusion barrier layer 216 may include a conductive 2-dimensional material (e.g., having one or more layers), titanium nitride, or tantalum nitride, among other examples. A conductive structure 218 (e.g., a copper interconnect or another conductive interconnect) may be disposed within the recessed portion of the dielectric structure in addition to, or including, the diffusion barrier layer 216. The conductive structure 218 includes a concave recessed portion on a top surface of the conductive structure 218. The concave recessed portion may be formed based on dishing caused by a CMP process.

The first wafer 202 includes multiple layers of conductive material 220 disposed within the concave recessed portion of the conductive structure 218. Layers of the multiple layers of conductive material 220 may be homogenous or may be heterogeneous. For example, layers may have different thicknesses and/or doping to reduce a size and/or depth of the concave recessed portion, to reduce dielectric erosion, and/or to improve conductivity between the conductive structure 208 and a conductive structure of the second wafer 204 (e.g., a conductive structure 224). In some implementations, the multiple layers of conductive material 220 may include a carbon-based material (e.g., graphene).

The multiple layers of conductive material 220 may selectively form on a substantially planar top surface for the first wafer 202. In some implementations, a top surface of the multiple layers of conductive material 220 is generally planar with a top surface of the dielectric structure of the first wafer 202. The dielectric structure, the diffusion barrier layer 216, the conductive structure 218, and/or the multiple layers of conductive material 220 may be included in a second layer of the first wafer 202.

The second wafer 204 includes a substrate 222 (e.g., a dielectric structure and/or a silicon-based structure) having a conductive structure 224 (e.g., a metal structure and/or a top metal) disposed within a recessed portion of the substrate 222. The substrate 222 and the conductive structure 224 may be included in a first layer of the second wafer 204.

The second wafer 204 includes a dielectric structure disposed on a top surface of the substrate 222 and the conductive structure 224. The dielectric structure may include a barrier layer 226, a redistribution oxide layer 228, and/or a bonding dielectric layer 230. The bonding dielectric layer 230 may include a heterostructure having nitrogen and/or hydrogen dopants. The dielectric structure includes a recessed portion that extends from a surface of the dielectric structure (e.g., a bottom surface of the bonding dielectric layer 230 as shown in FIG. 2 or a top surface of the bonding dielectric layer 230 before bonding) to the conductive structure 224.

In some implementations, the second wafer 204 includes a diffusion barrier layer 232 disposed within the recessed portion of the dielectric structure. The diffusion barrier layer 232 may include a conductive 2-dimensional material (e.g., having one or more layers), titanium nitride, or tantalum nitride, among other examples. A conductive structure 234 (e.g., a copper interconnect or another metal interconnect) may be disposed within the recessed portion of the dielectric structure in addition to, or including, the diffusion barrier layer 232. The conductive structure 234 includes a concave recessed portion on a surface of the conductive structure 234 (e.g., a bottom surface of the conductive structure 234 as shown in FIG. 2 or a top surface of the conductive structure 234 before bonding).

The second wafer 204 includes a conductive metal nitride material 238 disposed within the concave recessed portion (dishing) of the conductive structure 234 and a doped portion 236 of the dielectric structure (e.g., a phase transferred layer). The metal nitride material 238 may include copper nitride, titanium nitride, tantalum nitride, cobalt nitride, and/or molybdenum nitride, among other examples. A type and/or amount of doping may be configured to reduce a size and/or depth of the concave recess, to reduce dielectric erosion, and/or to improve conductivity between the conductive structure 208 and the conductive structure 224. For example, the type of doping may include a heterostructure with nitrogen and/or hydrogen dopants to improve bonding strength and/or to reduce dielectric erosion. The metal nitride material 238 may form a substantially planar top surface for the second wafer 204. In some implementations, a top surface of the metal nitride material 238 is generally planar with a top surface of the dielectric structure of the second wafer 204. The dielectric structure, the diffusion barrier layer 232, the conductive structure 234, and/or the metal nitride material 238 may be included in a second layer of the second wafer 204.

As indicated above, FIG. 2 is provided as an example. Other examples may differ from what is described with regard to FIG. 2. For example, a first wafer having multiple layers of conductive material disposed within a concave recessed portion of a conductive structure may be bonded to a second wafer having multiple layers of conductive material (e.g., a same conductive 2-dimensional layered material or a heterostructure conductive 2-dimensional layered material) disposed within a concave recessed portion of a conductive structure. Alternatively, a first wafer having a metal nitride material disposed within a concave recessed portion of a conductive structure may be bonded to a second wafer having a metal nitride material disposed within a concave recessed portion of a conductive structure. In another example, a first wafer having a dielectric oxide as a bonding dielectric may be bonded to a second wafer having a dielectric oxide or a dielectric nitride bonding dielectric. Alternatively, a first wafer having a dielectric nitride as a bonding dielectric may be bonded to a second wafer having a dielectric oxide or a dielectric nitride bonding dielectric.

FIGS. 3A-3H are diagrams of an example implementation 300 described herein. Example implementation 300 may be an example process for forming a semiconductor structure (e.g., the first wafer 202 of the semiconductor structure 200). The semiconductor structure may include one or more additional devices, structures, and/or layers not shown in FIGS. 3A-3H.

Figure 3A:
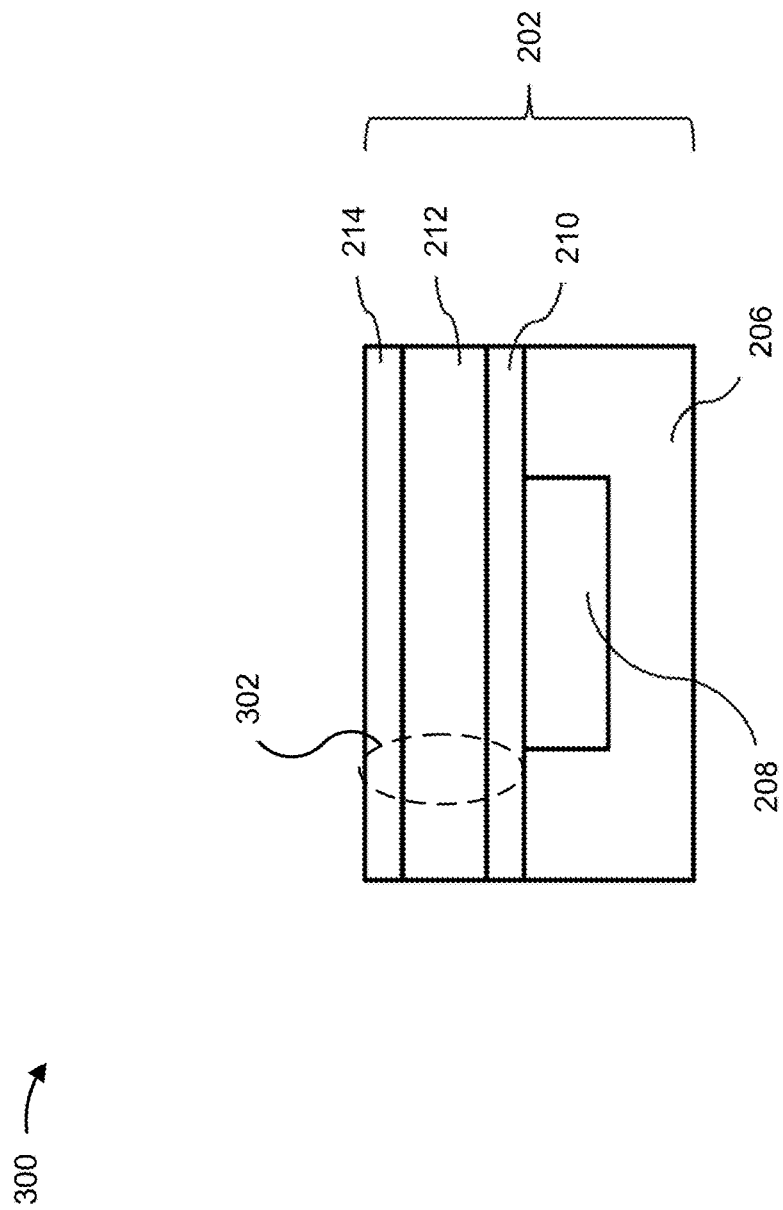

As shown in FIG. 3A, example implementation 300 may include forming a conductive structure 208 within a substrate 206. In some implementations, a deposition tool (e.g., deposition tool 102) deposits the conductive structure 208 as a top metal layer (e.g., a top layer of an inter-metal dielectric layer) of a silicon substrate (the substrate 222). In some implementations, the deposition tool uses chemical vapor deposition or physical vapor deposition, among other examples, to deposit the conductive structure 208 within the recessed portion of the substrate 206. In some implementations, a planarization tool (e.g., planarization tool 106) may polish and/or planarize the conductive structure 208 and the substrate 206.

As further shown in FIG. 3A, example implementation 300 may include forming a dielectric structure 302 on a top surface of the conductive structure 208 and the substrate 206. The dielectric structure 302 includes a barrier layer 210, a redistribution oxide layer 212, and/or a bonding dielectric layer 214. In some implementations, a deposition tool (e.g., deposition tool 102) deposits the dielectric structure 302 on the top surface of the conductive structure 208 and the substrate 206 using multiple deposition processes to deposit multiple layers of the dielectric structure 302. In some implementations, the deposition tool uses chemical vapor deposition or physical vapor deposition, among other examples, to deposit the dielectric structure 302 on the top surface of the conductive structure 208 and the substrate 206. In some implementations, a planarization tool (e.g., planarization tool 106) may polish and/or planarize one or more layers (e.g., the barrier layer 210, the redistribution oxide layer 212, and/or the bonding dielectric layer 214) of the dielectric structure 302 during and/or after depositing the dielectric structure 302.

Figure 3B:
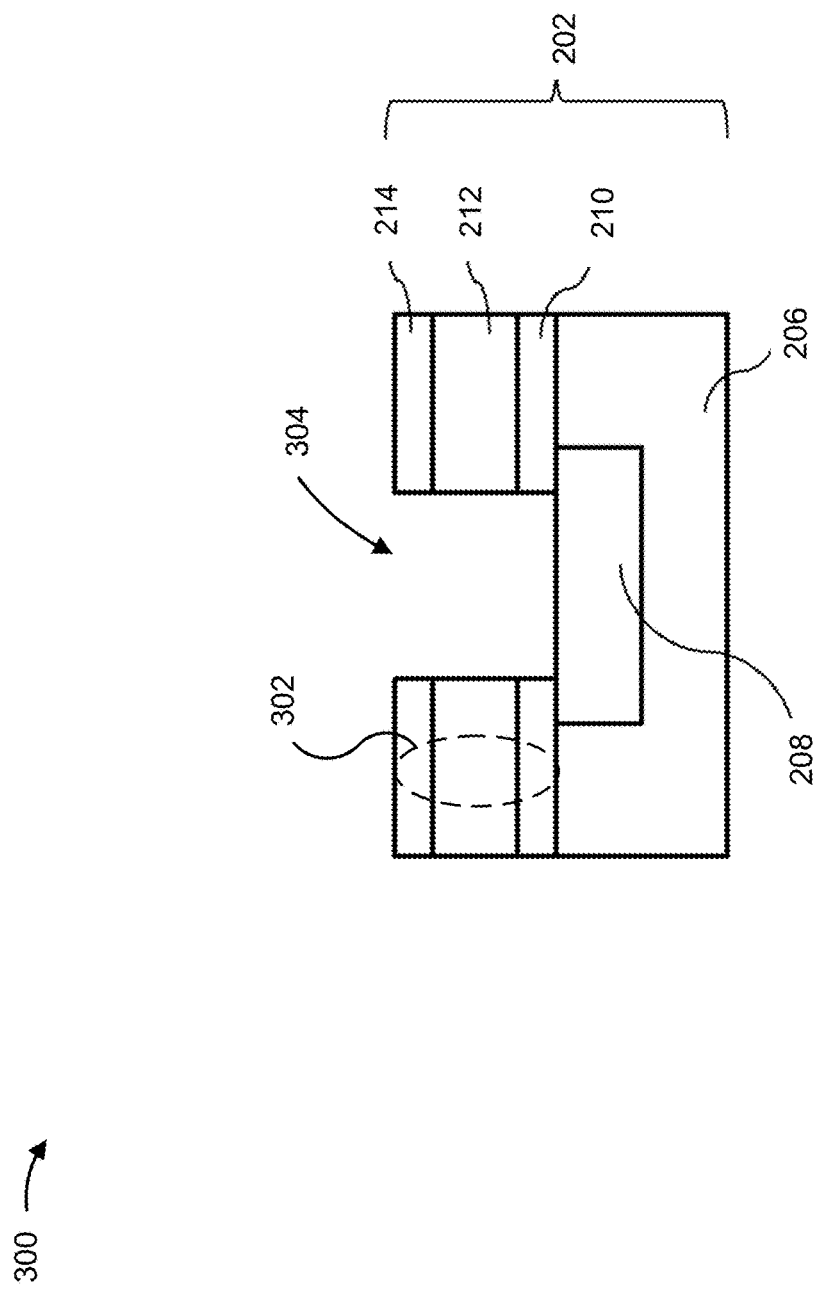

As shown in FIG. 3B, example implementation 300 may include forming a recessed portion 304 of the dielectric structure 302. In some implementations, an etching tool (e.g., etching tool 104) may etch a portion of the dielectric structure 302 to form the recessed portion 304.

Figure 3C:
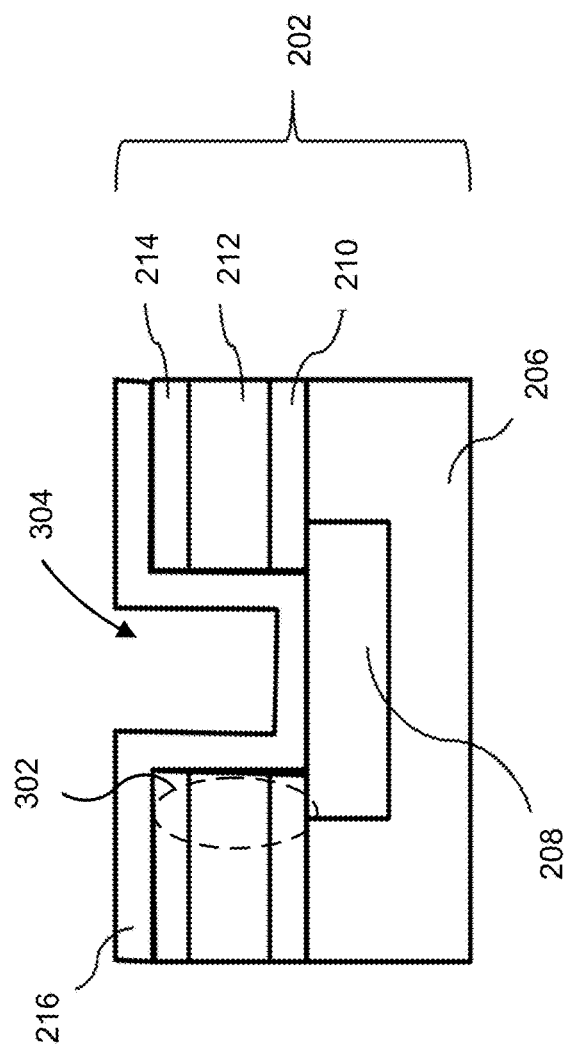

As shown in FIG. 3C, example implementation 300 may include forming a diffusion barrier layer 216 within the recessed portion 304 of the dielectric structure 302. In some implementations, a deposition tool (e.g., deposition tool 102) deposits material of the diffusion barrier layer 216 on a top surface of the dielectric structure 302, on sidewalls of the recessed portion 304, and/or on a bottom surface of the recessed portion 304 (e.g., on a top surface of the conductive structure 208). In some implementations, the deposition tool uses chemical vapor deposition or physical vapor deposition, among other examples, to deposit the material of the diffusion barrier layer 216 on the top surface of the dielectric structure 302, on the sidewalls of the recessed portion 304, and/or on the bottom surface of the recessed portion 304.

Figure 3D:
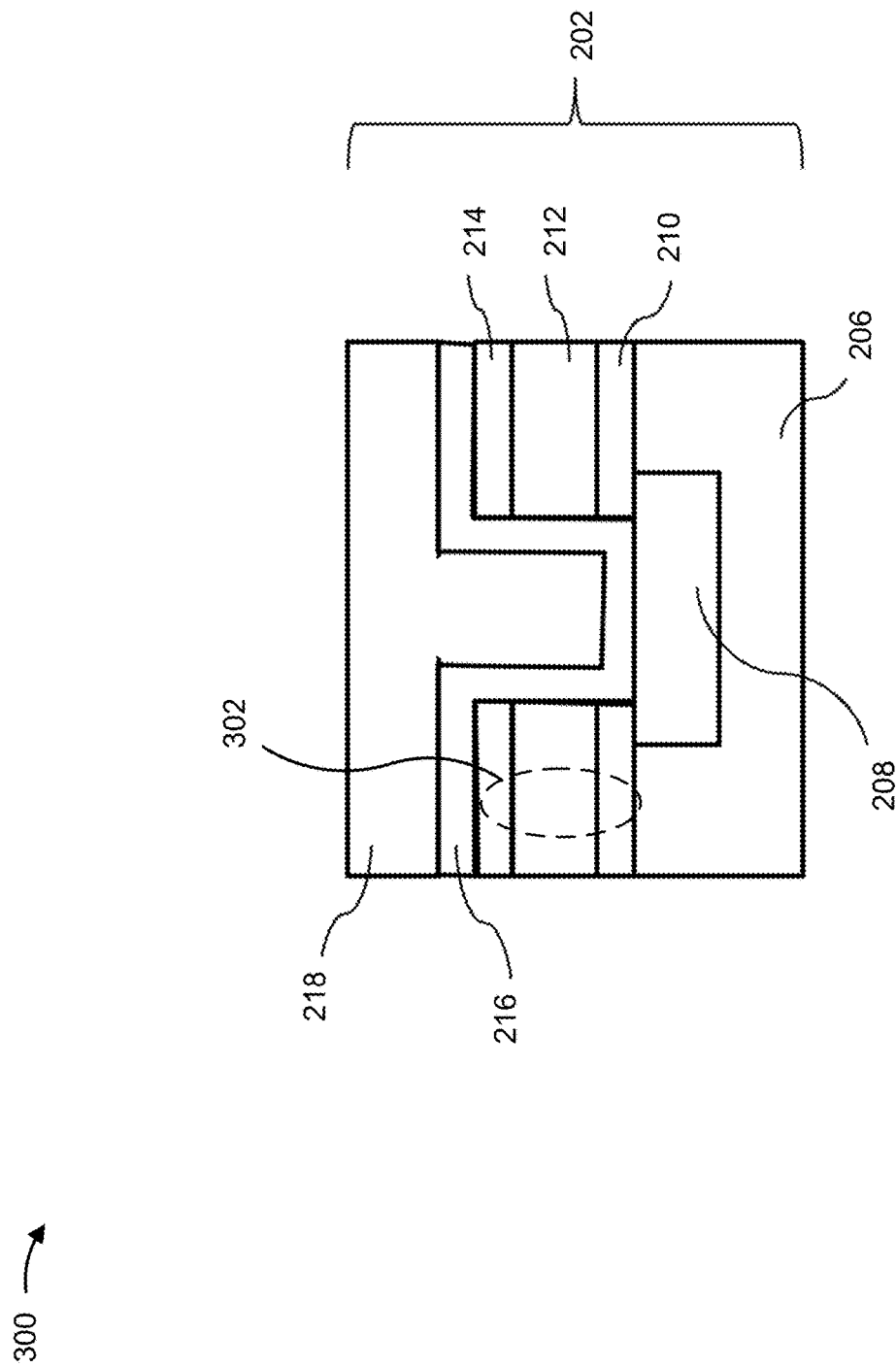

As shown in FIG. 3D, example implementation 300 may include forming a conductive structure 218 on the diffusion barrier layer 216 (e.g., within the recessed portion 304 of the dielectric structure 302 and on the top surface of the dielectric structure 302). In some implementations, a deposition tool (e.g., deposition tool 102) deposits material of the conductive structure 218 on a top surface of the diffusion barrier layer 216 such that the material of the conductive structure 218 fills the recessed portion 304. In some implementations, the deposition tool uses chemical vapor deposition or physical vapor deposition, among other examples, to deposit the material of the conductive structure 218 on a top surface of the diffusion barrier layer 216. The conductive structure 218 may include a copper-based material or a tungsten-based material. In some implementations, the conductive structure 218 may further include other materials (e.g., as a barrier layer), such as a tantalum-based material, a titanium-based material, and/or a ruthenium-based material.

Alternatively, the conductive structure 218 may be formed within the recessed portion 304 without first depositing the diffusion barrier layer 216. In some implementations, a deposition tool (e.g., deposition tool 102) deposits material of the conductive structure 218 within the recessed portion 304 in direct contact with the conductive structure 208 and/or sidewalls of the recessed portion 304. In some implementations, the deposition tool uses chemical vapor deposition or physical vapor deposition, among other examples, to deposit the material of the conductive structure 218 in direct contact with the conductive structure 208 and/or sidewalls of the recessed portion 304.

Figure 3E:
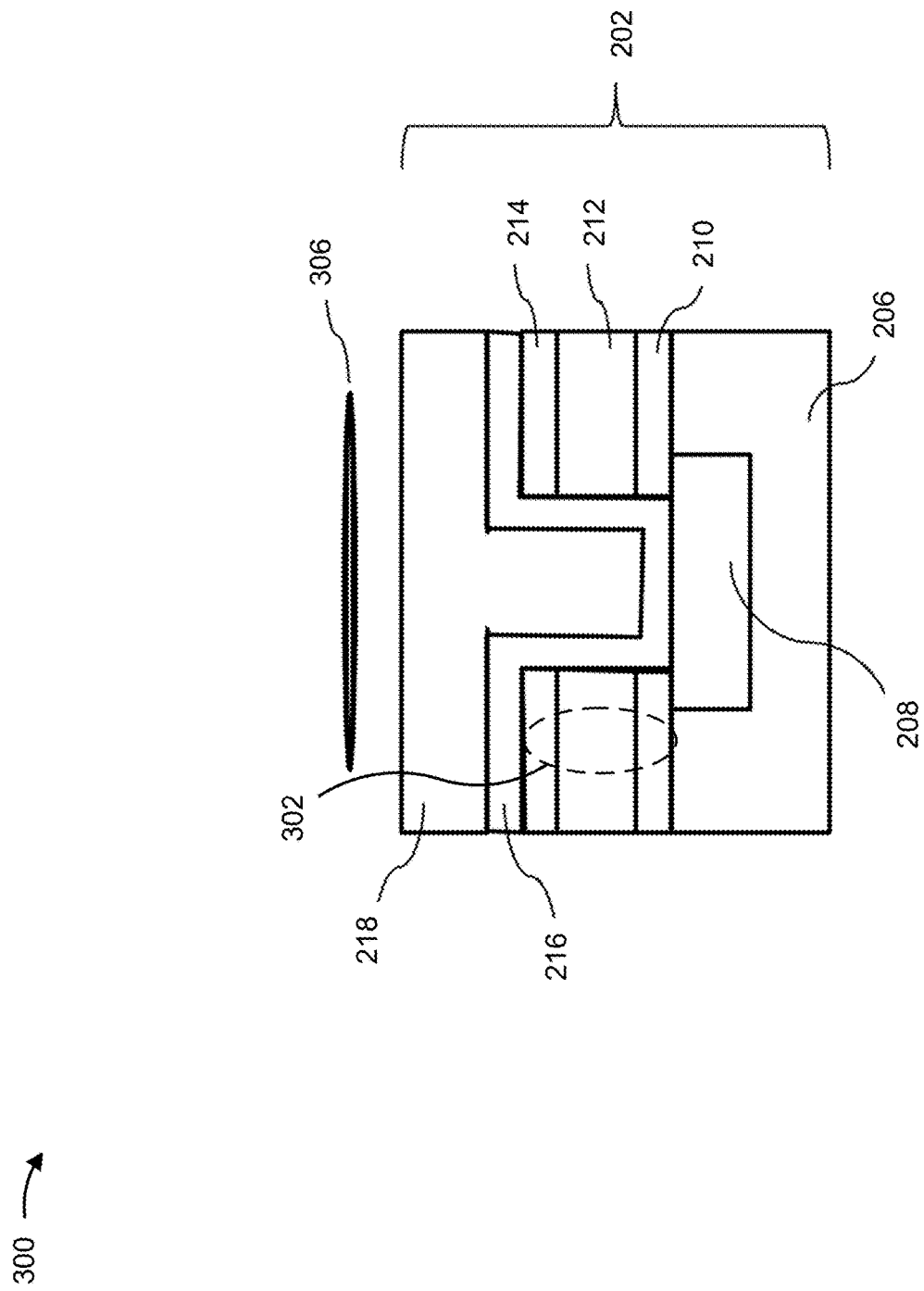

As shown in FIG. 3E, example implementation 300 may include using a planarization tool 306 to polish and/or planarize a top surface of the first wafer 202. For example, the planarization tool 306 (e.g., planarization tool 106) may grind away a portion of the conductive structure 218 and/or a portion of the diffusion barrier layer 216. In some implementations, the planarization tool 306 may be configured to perform a CMP process calibrated to remove the portion of the conductive structure 218 and/or the portion of the diffusion barrier layer 216 that is disposed on a top surface of the dielectric structure 302 and outside of the recessed portion 304.

As shown in FIG. 3F, after performing the CMP process, the first wafer 202 includes a concave recessed portion 308 (e.g., dished portion) formed on a top surface of the conductive structure 218. In some implementations, the concave recessed portion 308 may extend laterally across a top surface of the conductive structure 218 from a first side of the top surface of the dielectric structure 302 to a second side of the top surface of the dielectric structure 302. In some implementations, the concave recessed portion 308 extends laterally across only a portion of the conductive structure 218 (e.g., a center portion).

Figure 3G:
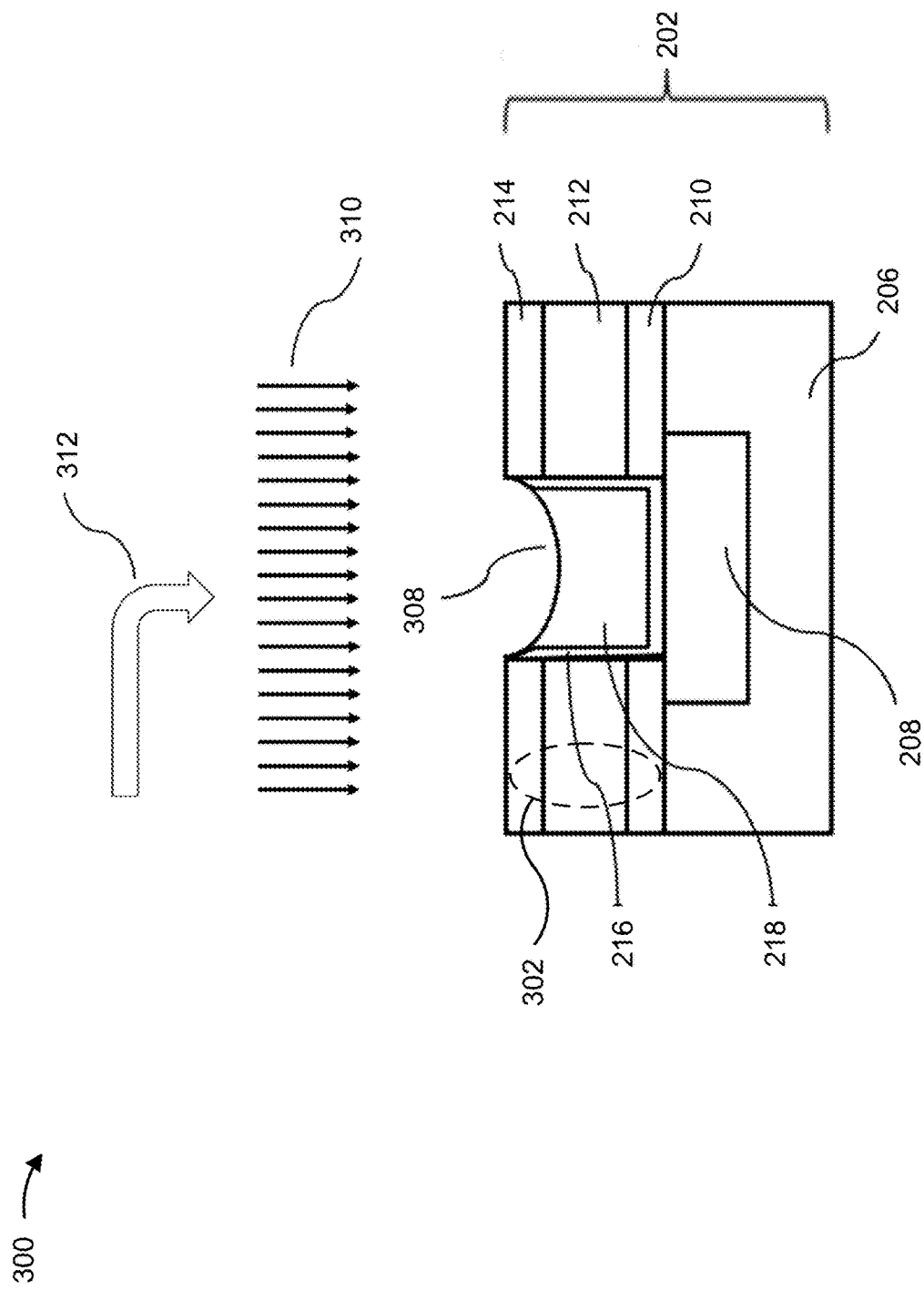

As shown in FIG. 3G, example implementation 300 may include using a plasma 310 (e.g., a hydrogen plasma, a nitrogen plasma, or an argon plasma, among other examples) to ionize a conductive material source (e.g., a 2-dimensional material source) disposed via an inlet 312. A deposition tool (e.g., deposition tool 102) may deposit the conductive material source and/or provide the plasma 310 at a temperature within a range of approximately 150 degrees Celsius to approximately 400 degrees Celsius. In this way, the deposition tool may deposit the conductive material source and/or provide the plasma 310 at a temperature with an operation range for plasma deposition (e.g., plasma vapor deposition). In some implementations, the first wafer 202 may be positioned within a plasma chamber at a distance from the plasma 310 to allow for the conductive material source to interact with the plasma 310 before reaching the first wafer 202. The first wafer 202 may be positioned to be perpendicular to the plasma 310 (e.g., with the plasma 310 directed at the top surface of the dielectric structure 302).

In some implementations, the conductive material source may include a carbon source (e.g., a methane source) that decomposes into carbon feedstock based on ionization by the plasma 310. A carrier gas (e.g., nitrogen gas and/or hydrogen gas, among other examples) may carry the conductive material source from the inlet 312 to the plasma 310 and from the plasma 310 to the first wafer 202. Based on the carrier gas being hydrogen gas, a surface of the concave recessed portion 308 may be activated (e.g., based on an etching behavior of the hydrogen gas), which may cause the concave recessed portion 308 to absorb the carbon feedstock, the carbon feedstock to nucleate, and graphene to grow on the concave recessed portion 308. Alternatively, based on the carrier gas being nitrogen gas, the carbon feedstock may be doped with nitrogen to form graphitic carbon nitride that adheres to the surface of the concave recessed portion 308.

Figure 3H:
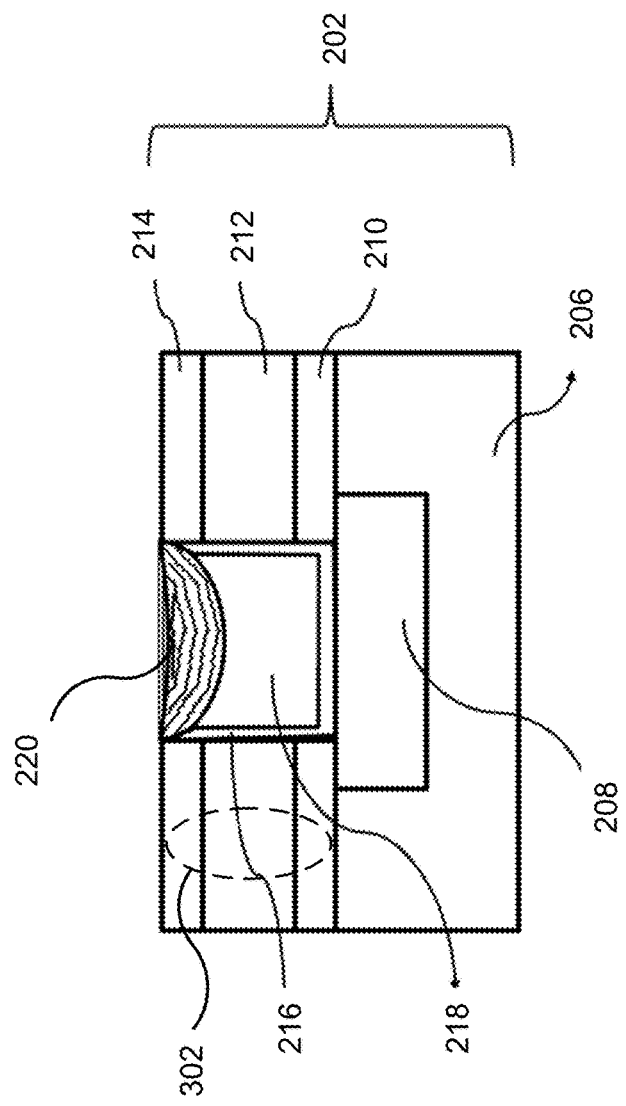

As shown in FIG. 3H, example implementation 300 may include forming a conductive material 220 that includes multiple layers of the conductive material 220 (e.g., multiple 2-dimensional layers). In some implementations, the conductive material 220 may include graphene, molybdenum carbide, 1T transition metal dichalcogenide, and/or metallic layer materials. The conductive material 220 may have a thickness that is less than approximately 20 nanometers and/or a same thickness as a thickness of the concave recessed portion 308 of the conductive structure 218. In some implementations, a deposition tool (e.g., deposition tool 102) deposits the conductive material 220 in multiple layers (e.g., 2-dimensional layers) using multiple deposition processes. The deposition tool may deposit a number of layers of the conductive material 220 that is based on (e.g., tuned for) growth parameters, such as plasma power (e.g., in a range of approximately 50 Watts to approximately 250 Watts), carrier gas ratio, growth duration, pressure, and/or temperature associated with the deposition. In some implementations, the deposition tool uses CVD, metal-organic CVD (MOCVD), or PECVD to deposit the conductive material 220 within the concave recessed portion 308. In some implementations, the deposition tool may use a bottom-up or a top-down deposition technique to deposit the conductive material 220.

In some implementations, example implementation 300 may include removing a portion of the conductive material 220 that is disposed above the top surface of the dielectric structure 302. For example, an etching tool (e.g., etching tool 104) may etch the portion of the conductive material 220 that is disposed above the top surface of the dielectric structure 302. The etching tool may use a plasma etching process to remove the portion of the conductive material 220. For example, the etching tool may use oxygen plasma to remove the portion of the conductive material 220 (e.g., if the conductive material comprises graphene). In this way, a top surface of the first wafer 202 may be generally planar and/or suitable for hybrid bonding. For example, the top surface of the first wafer 202 may have a concave recessed portion that has a thickness that is less than approximately 20 nanometers.

As indicated above, FIGS. 3A-3H are provided as an example. Other examples may differ from what is described with regard to FIGS. 3A-3H. The number and arrangement of devices, layers, and/or materials shown in FIGS. 3A-3H are provided as an example. In practice, there may be additional devices, layers, and/or materials, fewer devices, layers, and/or materials, different devices, layers, and/or materials, or differently arranged devices, layers, and/or materials than those shown in FIGS. 3A-3H.

FIGS. 4A-4H are diagrams of an example implementation 400 described herein. Example implementation 400 may be an example process for forming a semiconductor structure (e.g., the second wafer 204 of the semiconductor structure 200). The semiconductor structure may include one or more additional devices, structures, and/or layers not shown in FIGS. 4A-4H.

Figure 4A:
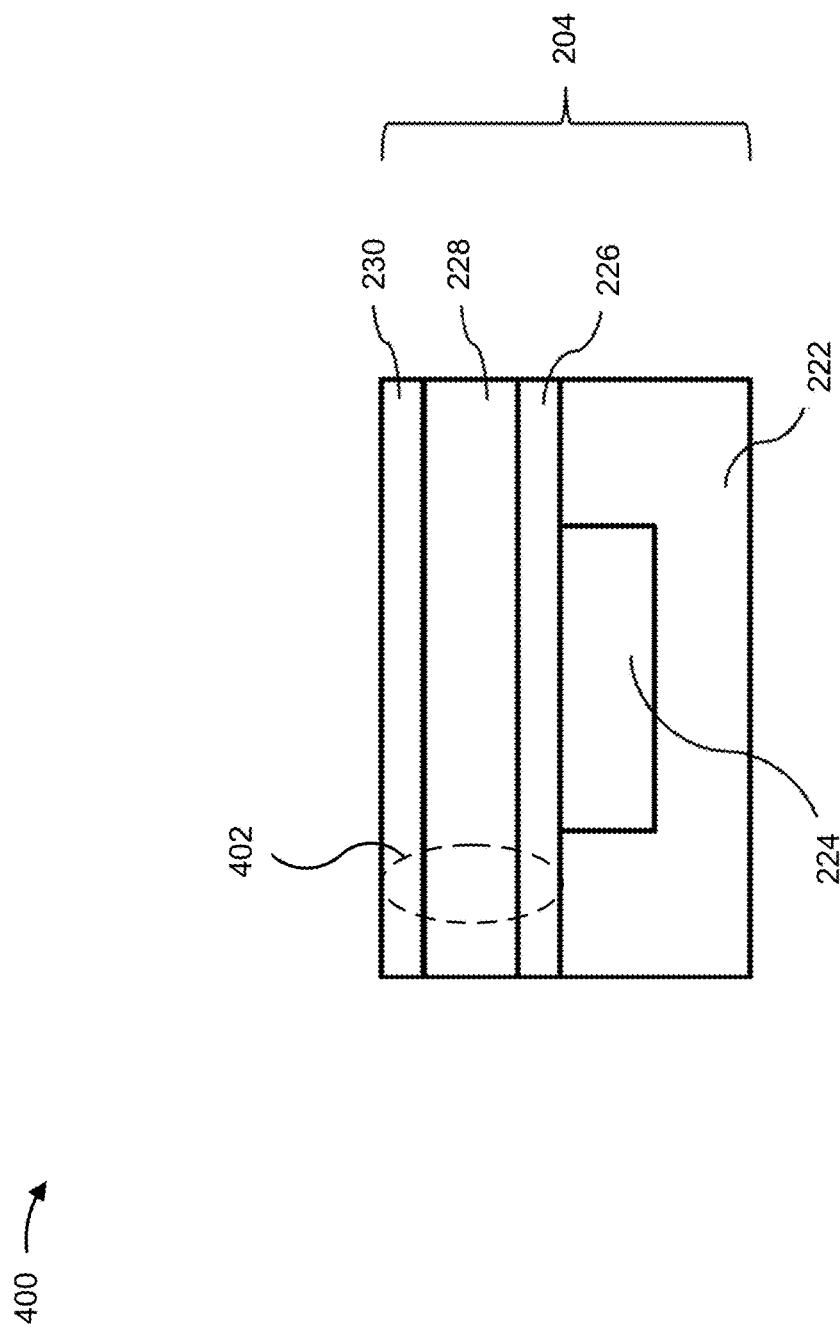
FIGS. 4A-4H are diagrams of an example implementation of forming a semiconductor structure described herein.

As shown in FIG. 4A, example implementation 400 may include forming a conductive structure 224 within a substrate 222. In some implementations, a deposition tool (e.g., deposition tool 102) deposits the conductive structure 224 as a top metal layer (e.g., a top layer of an inter-metal dielectric layer) of a silicon substrate (the substrate 222). In some implementations, the deposition tool uses chemical vapor deposition or physical vapor deposition, among other examples, to deposit the conductive structure 224 within the substrate 222. In some implementations, a planarization tool (e.g., planarization tool 106) may polish and/or planarize the conductive structure 224 and the substrate 222.

As further shown in FIG. 4A, example implementation 400 may include forming a dielectric structure 402 on a top surface of the conductive structure 224 and the substrate 222. The dielectric structure 402 includes a barrier layer 226 (e.g., silicon nitride, silicon dioxide, or dielectric 2-dimensional layers, among other examples), a redistribution oxide layer 228 (e.g., silicon dioxide, silicon oxycarbide, or high density plasma oxygen, among other examples), and/or a bonding dielectric layer 230 (e.g., silicon oxynitride, silicon dioxide, silicon oxycarbide, silicon carbon nitride, or a hybrid dielectric, among other examples). In some implementations, a deposition tool (e.g., deposition tool 102) deposits the dielectric structure 402 on the top surface of the conductive structure 224 and the substrate 222 using multiple deposition processes to deposit multiple layers of the dielectric structure 402. In some implementations, the deposition tool uses chemical vapor deposition or physical vapor deposition, among other examples, to deposit the dielectric structure 402 on the top surface of the conductive structure 224 and the substrate 222. In some implementations, a planarization tool (e.g., planarization tool 106) may polish and/or planarize one or more layers (e.g., the barrier layer 226, the redistribution oxide layer 228, and/or the bonding dielectric layer 230) of the dielectric structure 402 during and/or after depositing the dielectric structure 402.

Figure 4B:
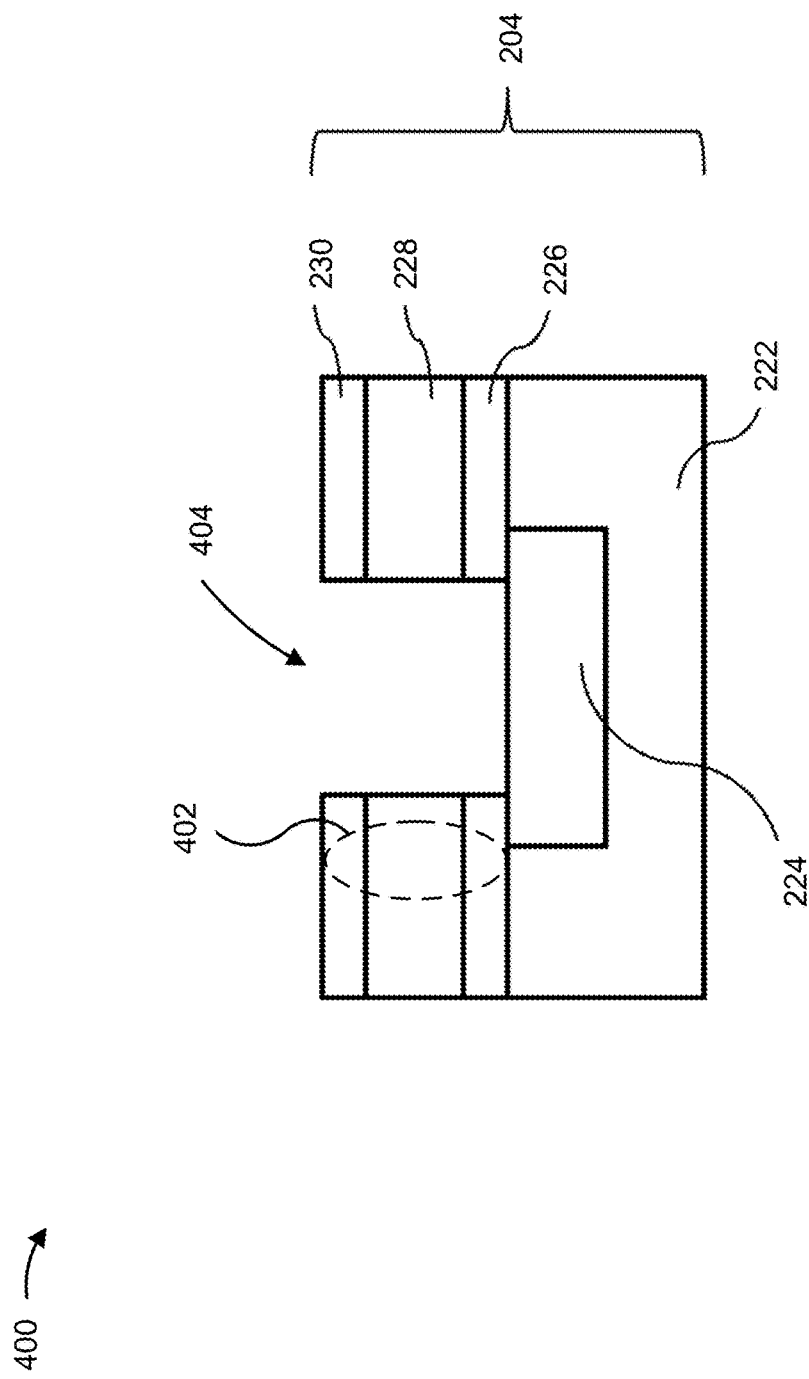

As shown in FIG. 4B, example implementation 400 may include forming a recessed portion 404 of the dielectric structure 402. In some implementations, an etching tool (e.g., etching tool 104) may etch a portion of the dielectric structure 402 to form the recessed portion 404.

Figure 4C:
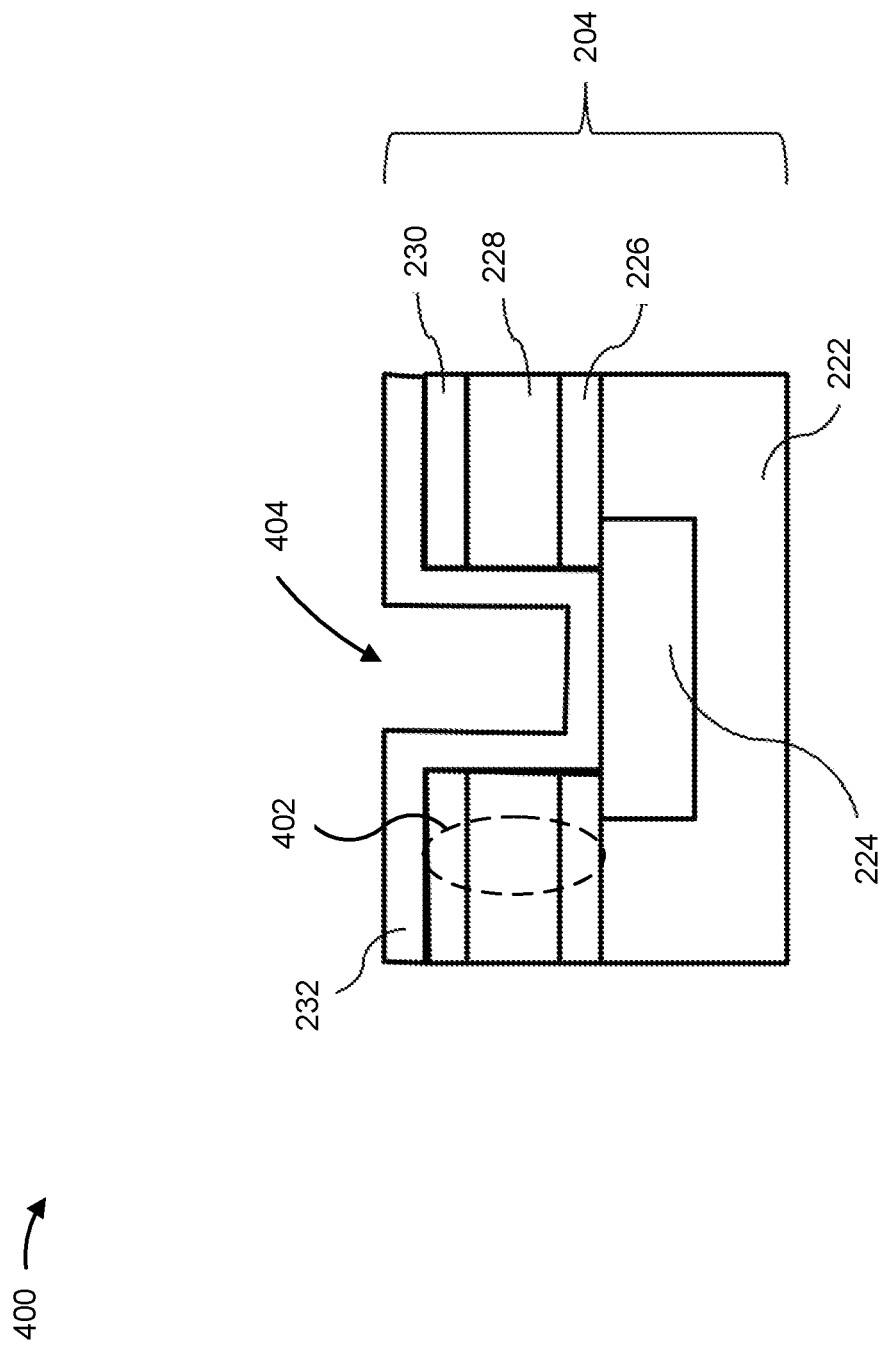

As shown in FIG. 4C, example implementation 400 may include forming a diffusion barrier layer 232 within the recessed portion 404 of the dielectric structure 402. In some implementations, a deposition tool (e.g., deposition tool 102) deposits material of the diffusion barrier layer 232 on a top surface of the dielectric structure 402, on sidewalls of the recessed portion 404, and/or on a bottom surface of the recessed portion 404 (e.g., on a top surface of the conductive structure 224). In some implementations, the deposition tool uses chemical vapor deposition or physical vapor deposition, among other examples, to deposit the material of the diffusion barrier layer 232 on the top surface of the dielectric structure 402, on the sidewalls of the recessed portion 404, and/or on the bottom surface of the recessed portion 404.

Figure 4D:
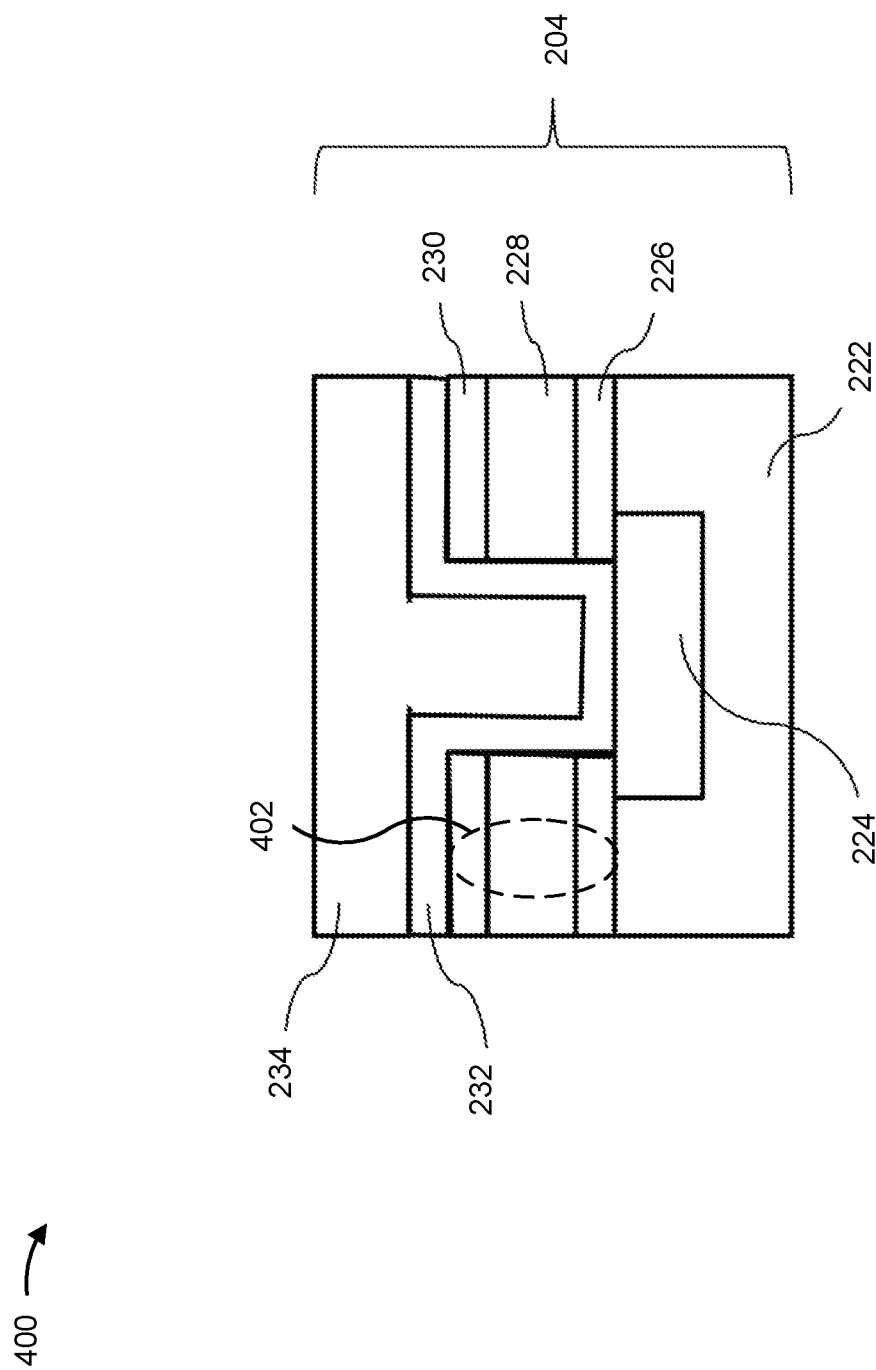

As shown in FIG. 4D, example implementation 400 may include forming a conductive structure 234 on the diffusion barrier layer 232 (e.g., within the recessed portion 404 of the dielectric structure 402 and on the top surface of the dielectric structure 402). In some implementations, a deposition tool (e.g., deposition tool 102) deposits material of the conductive structure 234 on a top surface of the diffusion barrier layer 232 such that the material of the conductive structure 234 fills the recessed portion 404. In some implementations, the deposition tool uses chemical vapor deposition or physical vapor deposition, among other examples, to deposit the material of the conductive structure 234 on a top surface of the diffusion barrier layer 232. The conductive structure 234 may include a copper-based material or a tungsten-based material. In some implementations, the conductive structure 234 may further include other materials (e.g., as a barrier layer), such as a tantalum-based material, a titanium-based material, and/or a ruthenium-based material.

Alternatively, the conductive structure 234 may be formed within the recessed portion 404 without first depositing the diffusion barrier layer 232. In some implementations, a deposition tool (e.g., deposition tool 102) deposits material of the conductive structure 234 within the recessed portion 404 in direct contact with the conductive structure 224 and/or sidewalls of the recessed portion 404. In some implementations, the deposition tool uses chemical vapor deposition or physical vapor deposition, among other examples, to deposit the material of the conductive structure 234 in direct contact with the conductive structure 224 and/or sidewalls of the recessed portion 404.

Figure 4E:
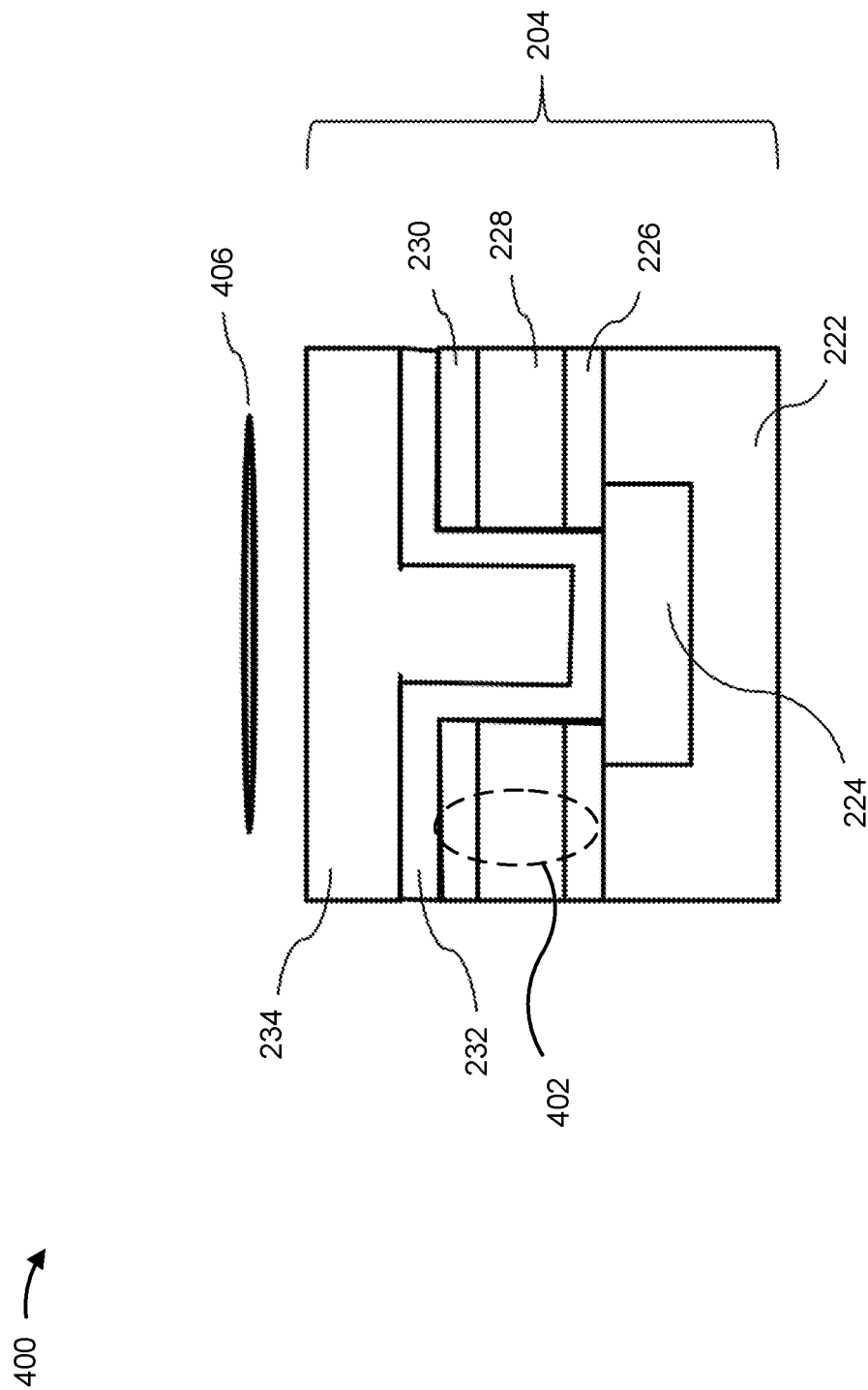

As shown in FIG. 4E, example implementation 400 may include using a planarization tool 406 to polish and/or planarize a top surface of the second wafer 204. For example, the planarization tool 406 (e.g., planarization tool 106) may grind away a portion of the conductive structure 234 and/or a portion of the diffusion barrier layer 232. In some implementations, the planarization tool 406 may be configured to perform a CMP process calibrated to remove the portion of the conductive structure 234 and/or the portion of the diffusion barrier layer 232 that is disposed on a top surface of the dielectric structure 402 and outside of the recessed portion 404.

Figure 4F:
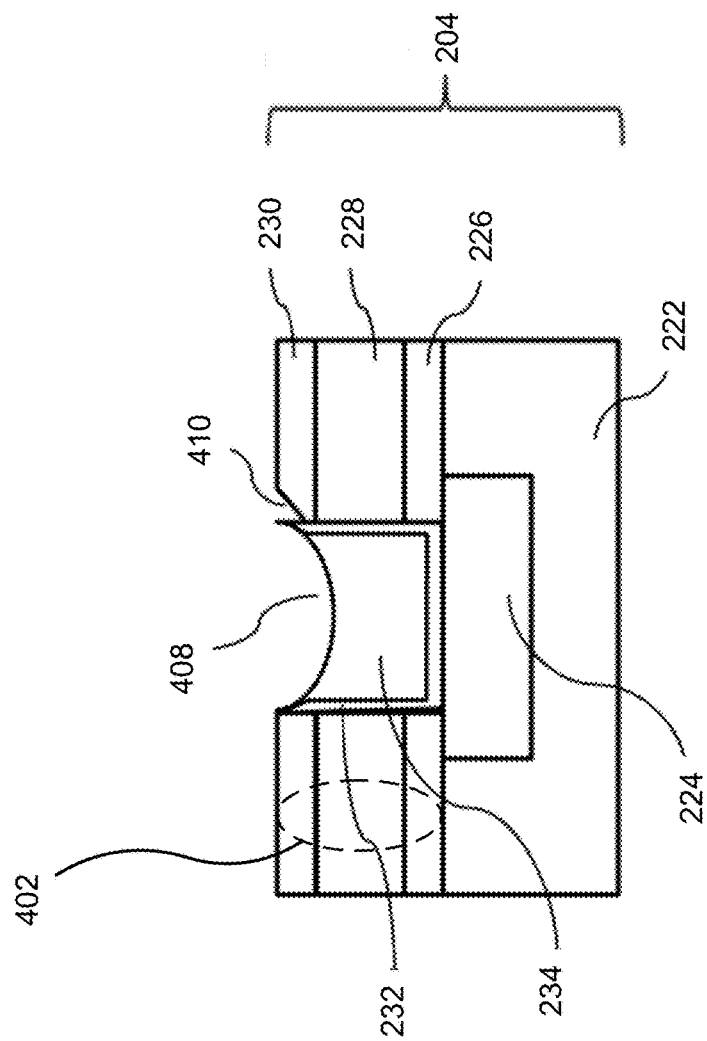

As shown in FIG. 4F, after performing the CMP process, the second wafer 204 includes a concave recessed portion 408 (dished portion) formed on a top surface of the conductive structure 234 and/or one or more recessed portions 410 of the dielectric structure 402 caused by dielectric erosion (e.g., within the bonding dielectric layer 230). In some implementations, the concave recessed portion 408 extends laterally across a top surface of the conductive structure 234 from a first side of the top surface of the dielectric structure 402 to a second side of the top surface of the dielectric structure 402. In some implementations, the concave recessed portion 408 extends laterally across only a portion of the conductive structure 234 (e.g., a center portion). The one or more recessed portions 410 may be disposed adjacent to the conductive structure 234.

Figure 4G:
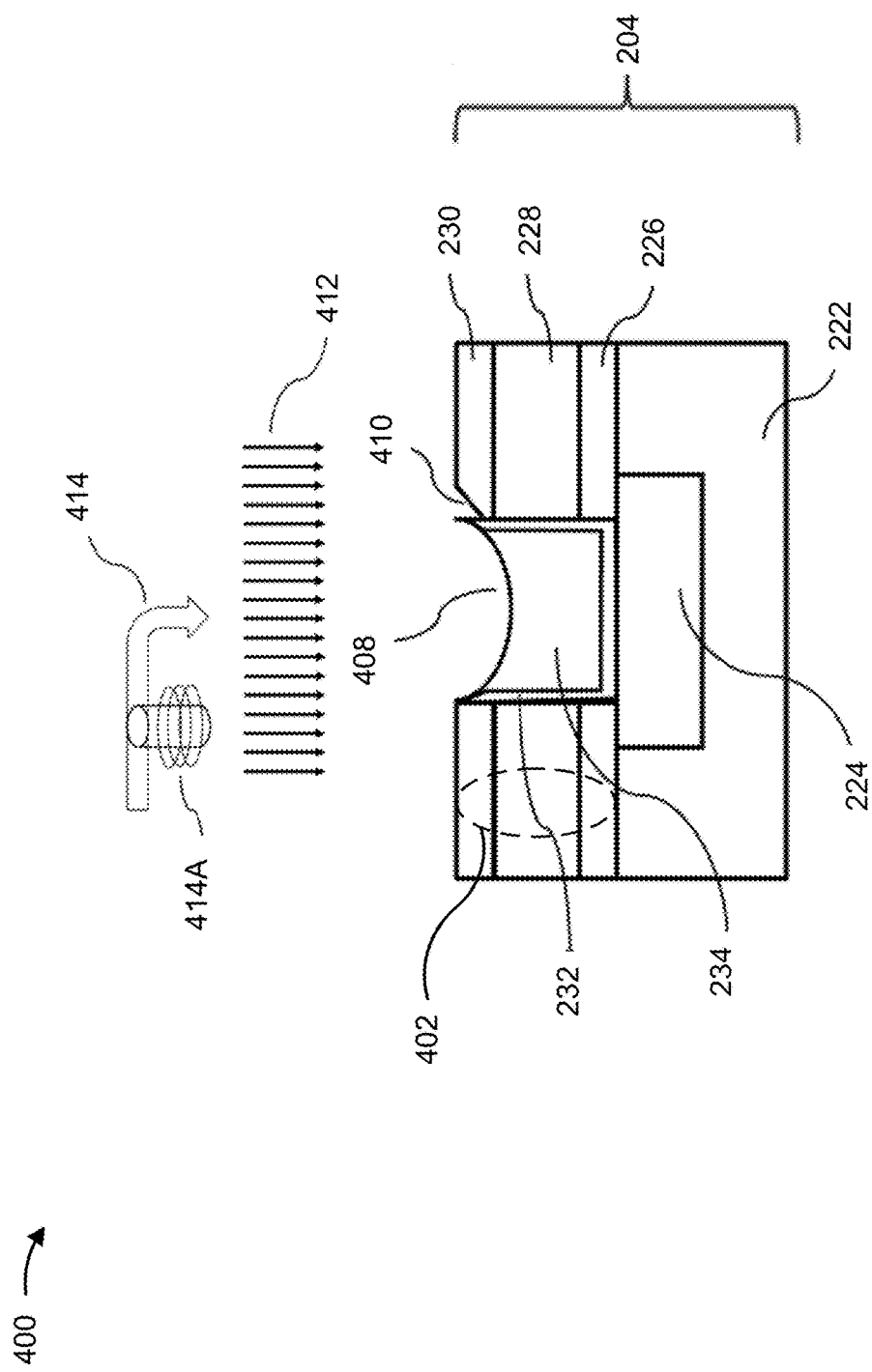

As shown in FIG. 4G, example implementation 400 may include using a plasma 412 (e.g., a nitrogen plasma) to ionize a conductive material source (e.g., a metal vapor source) disposed via an inlet 414. The conductive material source may be vaporized in a metal source chamber 414A that uses a heating coil or another heating element. A deposition tool (e.g., deposition tool 102) may deposit the conductive material source and/or provide the plasma 412 at a temperature within a range of approximately 150 degrees Celsius to approximately 400 degrees Celsius. In this way, the deposition tool may deposit the conductive material source and/or provide the plasma 412 at a temperature with an operation range for plasma deposition (e.g., plasma vapor deposition). In some implementations, the second wafer 204 may be positioned within a plasma chamber at a distance from the plasma 412 to allow for the conductive material source to interact with the plasma 412 before reaching the second wafer 204. The second wafer 204 may be positioned to be perpendicular to the plasma 412 (e.g., with the plasma 412 directed at the top surface of the dielectric structure 402).

In some implementations, the conductive material source may include a copper acetylacetonate that is vaporized in the metal source chamber 414A. A carrier gas (e.g., nitrogen gas, among other examples) may carry the conductive material source from the inlet 414 to the plasma 412 and from the plasma 412 to the second wafer 204.

The plasma 412 may activate a top surface of the conductive structure 234 using a partial nitrogenating reaction that also reacts on the top surface of the dielectric structure 402. When the conductive material source arrives at the top surface of the second wafer 204 after being ionized, the ionized conductive material source grows as a metal nitride (e.g., copper nitride) within the concave recessed portion 408 and fills the one or more recessed portions of the dielectric structure 402 based on depositing material from the carrier gas (e.g., nitrogen) into the top surface of the dielectric structure 402. For example, a silicon dioxide material of the dielectric structure may form silicon oxynitride (e.g., within one or more recessed portions 410 of the dielectric structure 402 caused by dielectric erosion) based on receiving the ionized conductive material. In some implementations, the one or more recessed portions 410 of the dielectric structure 402 caused by dielectric erosion, after receiving the ionized conductive material, may have a thickness that is less than approximately 20 nanometers.

Figure 4H:
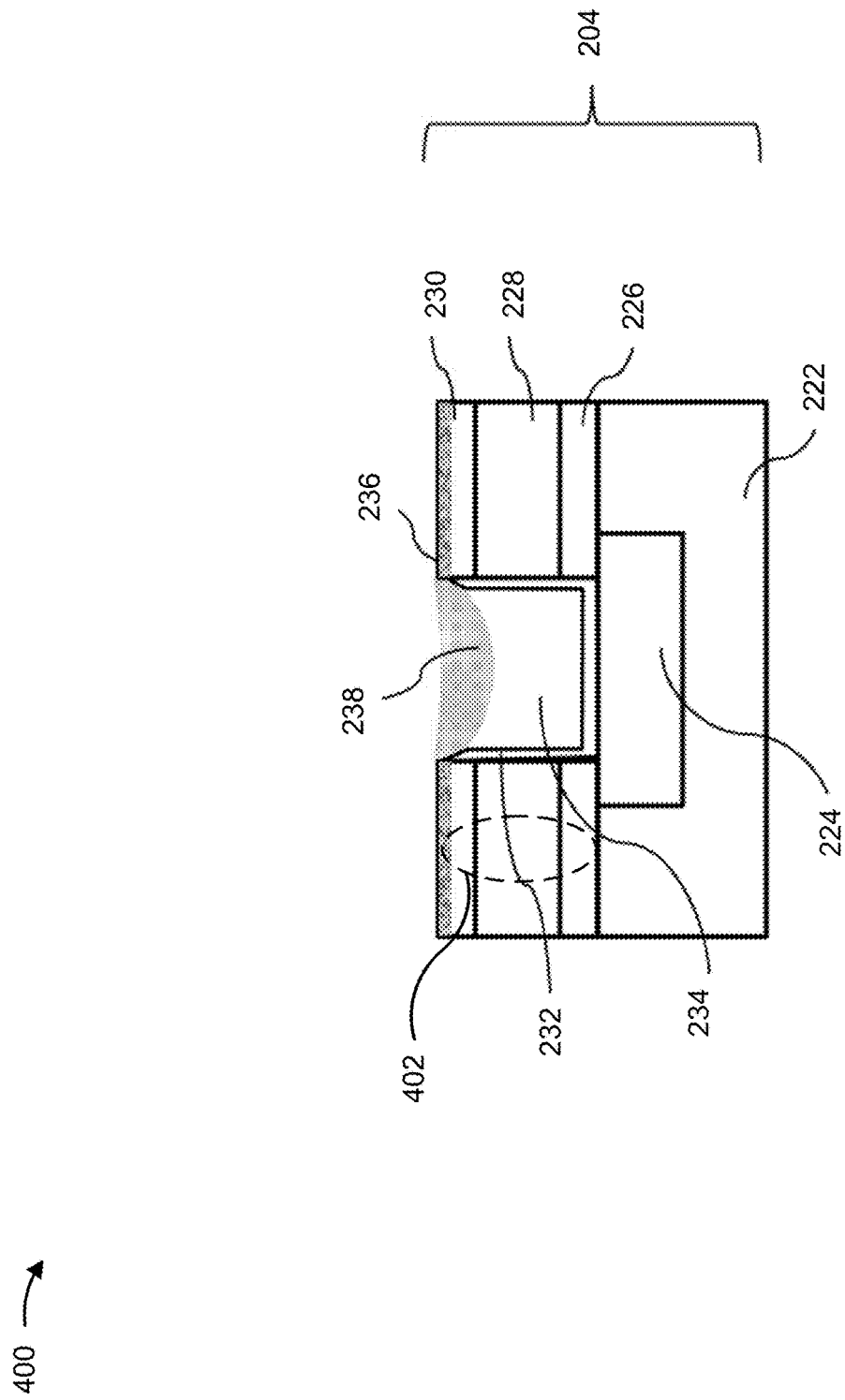

As shown in FIG. 4H, example implementation 400 may include forming a metal nitride material 238 (e.g., a conductive material) within the concave recessed portion 408 and forming a doped portion 236 of the dielectric structure 402 (e.g., doped with nitrogen or another carrier gas material) on a top surface of the dielectric structure 402. In some implementations, a deposition tool (e.g., deposition tool 102) deposits the metal nitride material 238 within the concave recessed portion 408. The deposition tool may deposit the metal nitride material 238 that is based on (e.g., tuned for) growth parameters, such as concentration of the metal nitride material 238 within the conductive material source (e.g., in a range of approximately 5 to approximately 500 standard cubic centimeters per minute), plasma power (e.g., in a range of approximately 50 Watts to approximately 250 Watts), growth duration, temperature, and/or pressure associated with the deposition. In some implementations, the deposition tool uses PECVD to deposit the metal nitride material 238 within the concave recessed portion 408.

In some implementations, example implementation 400 may include removing a portion of the metal nitride material 238 that is disposed above the top surface of the dielectric structure 402. For example, an etching tool (e.g., etching tool 104) may etch the portion of the metal nitride material 238 that is disposed above the top surface of the dielectric structure 402. The etching tool may use a plasma etching process to remove the portion of the metal nitride material 238. In this way, a top surface of the second wafer 204 may be generally planar and/or suitable for hybrid bonding. For example, the top surface of the second wafer 204 may have a concave recessed portion that has a thickness that is less than approximately 20 nanometers.

As indicated above, FIGS. 4A-4H are provided as an example. Other examples may differ from what is described with regard to FIGS. 4A-4H. The number and arrangement of devices, layers, and/or materials shown in FIGS. 4A-4H are provided as an example. In practice, there may be additional devices, layers, and/or materials, fewer devices, layers, and/or materials, different devices, layers, and/or materials, or differently arranged devices, layers, and/or materials than those shown in FIGS. 4A-4H.

Figure 5A:
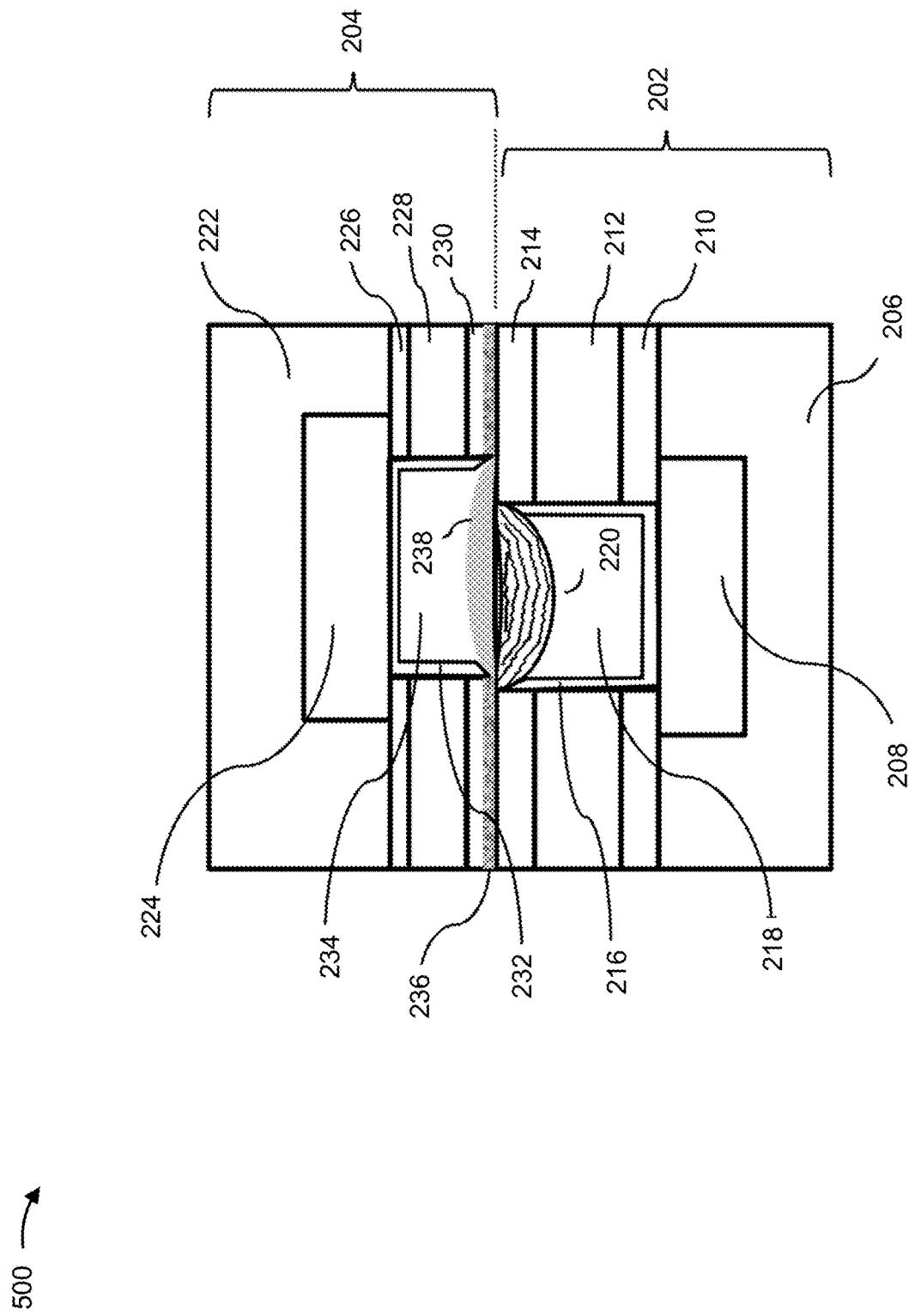
FIGS. 5A-5C are diagrams of an example implementation of forming a semiconductor structure described herein.
Figure 5B:
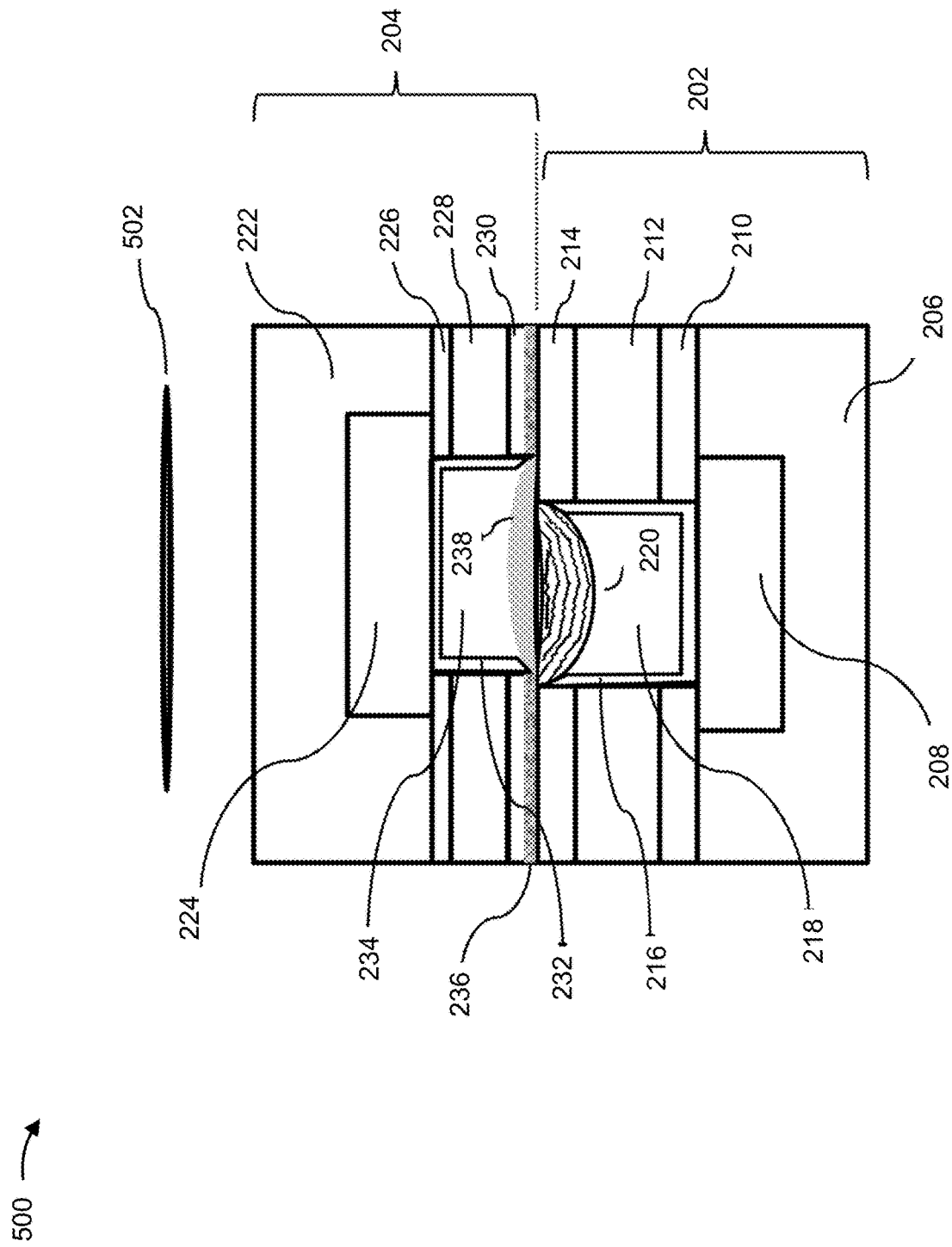
Figure 5C:
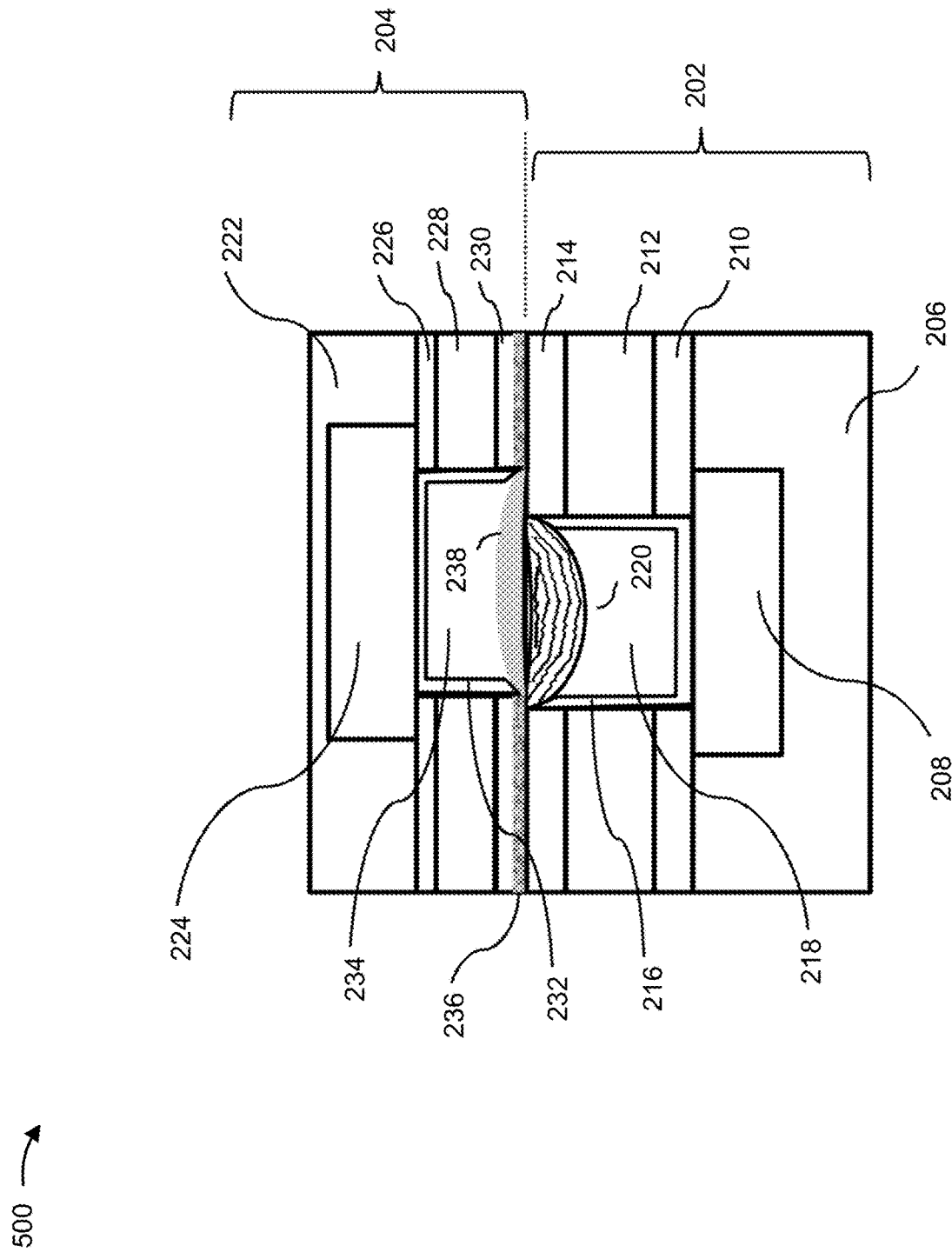

FIGS. 5A-5C are diagrams of an example implementation 500 described herein. Example implementation 500 may be an example process for forming a semiconductor structure (e.g., the semiconductor structure 200 including the first wafer 202 bonded to the second wafer 204). The semiconductor structure may include one or more additional devices, structures, and/or layers not shown in FIGS. 5A-5C.

As shown in FIG. 5A, example implementation 500 may include flipping the second wafer 204 and disposing the second wafer 204 on the first wafer 202. In some implementations, a bonding tool (e.g., bonding tool 108) may flip the second wafer 204 and place the second wafer 204 on the top surface of the first wafer 202. In this way, the conductive material 220 is in contact with the metal nitride material 238 and the dielectric structure 302 is in contact with the dielectric structure 402 (e.g., the doped portion 236 of the dielectric structure 402).

The conductive structure 208 may be electrically coupled to the conductive structure 224 via an electrical path that includes the conductive structure 218, the conductive material 220, the metal nitride material 238, and the conductive structure 234. Based on the first wafer 202 and the second wafer 204 having generally planar surfaces at a bonding interface, electrical coupling between the conductive structure 208 and the conductive structure 224 may have a reduced resistance when compared to a wafers without the conductive material 220 and/or the metal nitride material 238 disposed within concave recessed portions of conductive structures 218 and 234.

In some implementations, a bonding tool (e.g., bonding tool 108) may bond the first wafer 202 to the second wafer 204. In some implementations, the bonding tool may bond the first wafer 202 and the second wafer 204 at a temperature in a range of approximately 15 degrees Celsius to approximately 25 degrees Celsius. In this way, the bonding tool may bond the first wafer 202 and the second wafer 204 without adding external heat (e.g., using chemical bonding instead of heat bonding). The first wafer 202 may be bonded to the second wafer 204 based on chemical bonding (e.g., a formation of covalent bonds). In some implementations, 2-dimensional material of the conductive material 220 may use covalent bonding to bond to the metal nitride material 238 (e.g., copper nitride material). For example, carbon atoms in graphene and nitrogen atoms in metal nitride may form a covalent bond at the temperature in the range of approximately 15 degrees Celsius to approximately 25 degrees Celsius. Additionally, or alternatively, the doped portion 236 of the dielectric structure 402 may provide improved bonding with the dielectric structure 302 when compared to bonding between a non-doped portion of the dielectric structure 402 and the dielectric structure 302. Based on improved bonding between the first wafer 202 and the second wafer 204, post bonding annealing may be unnecessary.

In some implementations, the bonding tool may perform the bonding process for an amount of time in a range of approximately 5 minutes to approximately 3 hours. In this way, the first wafer 202 has sufficient time to bond with the second wafer 204. In some implementations, an amount of time for bonding may increase based on bonding at a relatively low temperature.

The conductive material 220 may provide a diffusion barrier to reduce electromigration from the conductive structure 218 into the second wafer 204 (e.g., electromigration into the dielectric structure 402 based on misalignment). In this way, deterioration of the conductive structure 218 may be reduced and a lifetime of the semiconductor structure 200 may be extended.

As shown in FIG. 5B, example implementation 500 may include using a planarization tool 502 (e.g., planarization tool 106) to polish and/or planarize the backside of surface of the second wafer 204 (bottom surface as shown in FIGS. 4A-4H). For example, the planarization tool 502 may grind away a portion of the substrate 222. In some implementations, the planarization tool 502 may be configured to perform a CMP process calibrated to thin and/or remove the substrate 222 for multi-wafer stacking (e.g., stacking of two or more wafers). Based on improved bonding between the first wafer 202 and the second wafer 204, a bond at the bonding interface may reduce, or avoid, delamination and/or a formation of voids.

As shown in FIG. 5C, example implementation 500 includes forming a semiconductor structure that includes the first wafer 202 and the second wafer 204, with a portion of the substrate 222 removed using a CMP process (e.g., a grinding process).

As indicated above, FIGS. 5A-5C are provided as an example. Other examples may differ from what is described with regard to FIGS. 5A-5C. The number and arrangement of devices, layers, and/or materials shown in FIGS. 5A-5C are provided as an example. In practice, there may be additional devices, layers, and/or materials, fewer devices, layers, and/or materials, different devices, layers, and/or materials, or differently arranged devices, layers, and/or materials than those shown in FIGS. 5A-5C.

Figure 6:
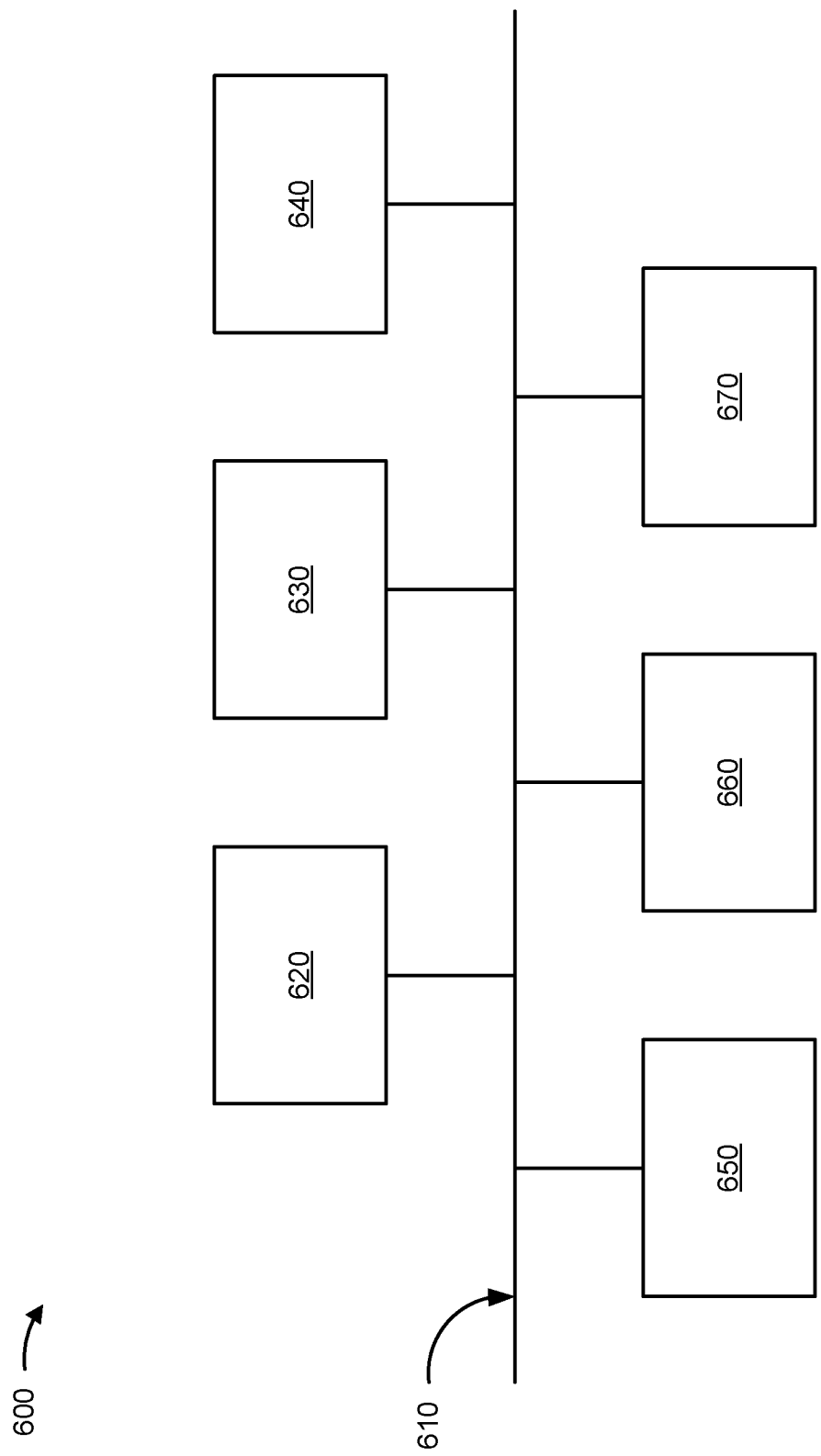
FIG. 6 is a diagram of example components of one or more devices of FIG. 1.

FIG. 6 is a diagram of example components of a device 600, which may correspond to deposition tool 102, etching tool 104, planarization tool 106, bonding tool 108, and/or wafer/die transport tool 110. In some implementations, deposition tool 102, etching tool 104, planarization tool 106, bonding tool 108, and/or wafer/die transport tool 110 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
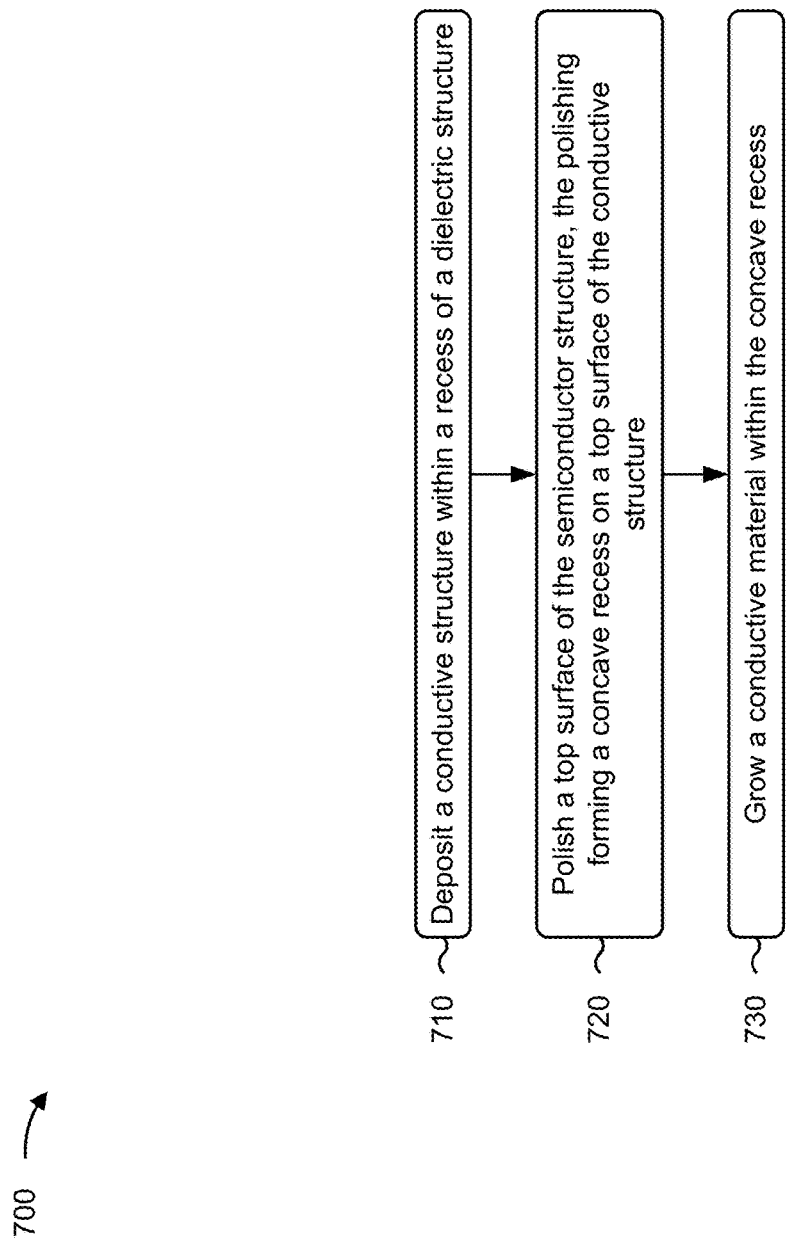
FIG. 7 is a flowchart of an example process relating to forming a semiconductor structure described herein.

FIG. 7 is a flowchart of an example process 700 associated with a manufacturing method for forming a semiconductor structure. In some implementations, one or more process blocks of FIG. 7 may be performed by one or more semiconductor processing tools (e.g., deposition tool 102, etching tool 104, planarization tool 106, bonding tool 108, and/or wafer/die transport tool 110). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include depositing a conductive structure within a recessed portion of a dielectric structure (block 710). For example, the one or more semiconductor processing tools may deposit a conductive structure 218, 234 within a recessed portion 304, 404 of a dielectric structure 302, 402, as described above.

As further shown in FIG. 7, process 700 may include polishing a top surface of the semiconductor structure, the polishing forming a concave recessed portion on a top surface of the conductive structure (block 720). For example, the one or more semiconductor processing tools may polish a top surface of the semiconductor structure 200, 202, 204, the polishing forming a concave recessed portion 308, 408 on a top surface of the conductive structure 218, 234, as described above.

As further shown in FIG. 7, process 700 may include growing a conductive material within the concave recessed portion to form a substantially planar top surface for the semiconductor structure (block 730). For example, the one or more semiconductor processing tools may grow a conductive material 220, 238 within the concave recessed portion 308, 408 to form a substantially planar top surface for the semiconductor structure, as described above.

Process 700 may include additional implementations, such as any single implementation or any combination of implementations described below and/or in connection with one or more other processes described elsewhere herein.

In a first implementation, growing the conductive material 220, 238 within the concave recessed portion 308, 408 comprises one or more of depositing multiple 2-dimensional layers of the conductive material 220, 238 within the concave recessed portion 308, 408, or growing a metal nitride material, within the concave recessed portion 308, 408, via ionized metal vapor deposition.

In a second implementation, alone or in combination with the first implementation, depositing the conductive structure 218, 234, polishing the top surface of the semiconductor structure 200, 202, 204, and growing the conductive material 220, 238 form a first wafer 202, 204, wherein the method further comprises forming a second wafer 202, 204 that comprises an additional dielectric structure 302, 402 and an additional conductive material 220, 238 at a bonding interface of the second wafer 202, 204, and bonding the second wafer 202, 204, at the bonding interface of the second wafer 202, 204, to the first wafer 202, 204 at a top surface of the first wafer 202, 204, wherein the conductive material 220, 238 is bonded to the additional conductive material 220, 238 and the dielectric structure 302, 402 is bonded to the additional dielectric structure 302, 402.

In a third implementation, alone or in combination with one or more of the first and second implementations, bonding the second wafer 202, 204 to the first wafer 202, 204 comprises bonding the second wafer 202, 204 to the first wafer 202, 204 at a temperature in a range of approximately 15 degrees Celsius to approximately 25 degrees Celsius.

In a fourth implementation, alone or in combination with one or more of the first through third implementations, the additional conductive material 220, 238 is grown, within an additional concave recessed portion 308, 408 of an additional conductive structure 218, 234 of the second wafer 202, 204, via one or more of depositing multiple 2-dimensional layers of the additional conductive material 220, 238 within the additional concave recessed portion 308, 408, or growing an additional metal nitride material, within the concave recessed portion 308, 408, via ionized metal vapor deposition.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, the one or more semiconductor processing tools may provide an improved planarization on a top surface of the semiconductor structure (e.g., one or more wafers of the semiconductor structure), which may form a uniform bonding interface (e.g., with reduced, or no, metal dishing or dielectric erosion). Additionally, or alternatively, a manufacturing process may omit a post bonding annealing process based on providing a smooth bonding surface and a covalent bond at the bonding interface. The improved planarization may increase mechanical strength at the bonding interface to enable multi-wafer stacking without, or with reduced, formation of voids or delamination. The increase mechanical strength may improve resistance to mechanical stress induced by a wafer thinning process (e.g., an additional CMP process) performed after bonding, protect metal at the bonding interface from degradation, avoid formation of relatively large metal grains at the bonding interface which may cause a reduction of metal interdiffusion, and/or enhance a surface purity, among other examples. Further, the improved planarization may reduce, or eliminate, metal oxide formation, improve a conductivity of the metal at the bonding interface, and/or avoid metal atom migration into a dielectric layer caused by misaligned bonding of metal at the bonding interface. Additionally, the semiconductor structure may be formed with a reduced a pitch length based on reducing cross talk between the metal at the bonding surfaces for adjacent devices of the semiconductor structure.

In some implementations, a structure includes a first wafer of a semiconductor device with a first barrier layer on a top metal, a first redistribution oxide layer, a first bonding dielectric layer with a first redistribution copper without dishing and/or erosion effect (e.g., based on applying plasma assisted grown 2D conductive or metal nitride layer) as a first bonding interface. The structure also includes a second wafer of the semiconductor device with a second bonding interface with a 2D conductive layer or a metal nitride layer to reduce dishing and/or dielectric erosion of a second copper redistribution layer, a second bonding dielectric layer with a phase transition of 1-5 nanometer thickness, a second redistribution oxide layer, and/or a second barrier layer on a second top metal. The structure further includes a hybrid bond that couples the first wafer and the second wafer (e.g., with hybrid bonding performed at room temperature) with a bonding interface of 2D conductive material or metal nitrides, and with or without post bonding treatments (e.g., thermal annealing among other examples). The structure may additionally include CMP thinning of the second wafer after hybrid bonding with or without any post bonding treatment.

The structure may further include one or more same conductive 2D layer or heterostructure conductive 2D materials or hybrid metal nitride compound materials on the first wafer and the second wafer as bonding interfaces or to reduce Cu dishing and/or dielectric erosion, and to increase a bonding strength by preparing uniform surfaces of the first wafer and the second wafer.

The structure may further include one or more barrier layers on the top metal, with the one or more barrier layers formed using 2D materials to use as a barrier layer and to scale down bonding layer thickness.

The structure may further include one or more bonding dielectric layers based on a 2D material or a dielectric, based on nitride compounds, to increase a bonding strength.

The structure may include different 2D materials with different thickness and/or doping to reduce Cu dishing, dielectric erosion, and/or to improve the conductivity of metal interconnects for hybrid bonding technology.

The structure may further include growth of 2D conductive material by different methods including CVD, MOCVD, bottom-up, and/or top-down processes.

The structure may include a bonding dielectric layer comprising a heterostructure with nitrogen and hydrogen dopants to increase the bonding strength and/or to reduce or avoid the dielectric erosion.

The structure may be formed using 2D materials and metal nitrides on multi-wafer stacking technology.

The structure may be formed using conductive 2D material as a Cu diffusion barrier layer.

A bonding interface of the structure may include a conductive 2D to 2D layer bond, conductive 2D to metal nitride bond, and/or metal nitride to metal nitride bond and a dielectric oxide to dielectric oxide bond, a dielectric nitride to dielectric nitride bond, and/or a dielectric oxide to dielectric nitride bond.

A copper diffusion barrier layer may include TaN, TiN, or conductive 2D materials. A first dielectric layer may include SiN, $SiO_2$, or dielectric 2D materials. An RDL dielectric layer may include $SiO_2$, SiOC, or HDP Ox. A bonding top layer/etch stop layer may include SiON, $SiO_2$, SiOC, SiCN, or other hybrid dielectrics. Plasma material may include $H_2$, $N_2$, or Ar, among other examples. A plasma power may be tuned to a range of approximately 50 watts to approximately 250 watts. A carrier gas may include $H_2$, $N_2$, $H_2+N_2$. The carrier gas may include a concentration of a deposition material in a range of approximately 5 sccm to approximately 500 sccm. A carbon source may include methane. A concentration of the carbon source may be in a range of approximately 5 sccm to approximately 500 sccm. A copper dishing thickness may be less than 20 nm. An erosion thickness may be less than 20 nm. A metal nitride thickness may be a same, or lower, thickness as a dishing thickness.

Conductive materials may include 2D materials, such as graphene, $Mo_2C$, 1T-TMD, $g-C_3N_4$, and/or metallic layer materials. The 2D material layer may have a same thickness as a dishing thickness (e.g., less than or equal to 20 nm). A metal nitride may include CuN, TiN, TaN, CoN, MoN, or another metal nitride material.

A heterostructure may include an interface dielectric bonding layer and may include a heterostructure of N and H doped oxide layers. Hybrid bonding may be performed at room temperature and/or for a duration in a range of approximately 15 minutes to approximately 3 hours.

In some implementations, the techniques described herein may be used to form wafer stacking of 2 to 4 wafers. The techniques described herein may be used for 3D stacking semiconductor, energy, opto-electric and 3D packaging. In some implementations, the structure having the stacked wafers may include a CIS, 3D IC, or a 3D RRAM device.

As described in greater detail above, some implementations described herein provide a semiconductor structure. The semiconductor structure includes a first conductive structure disposed within a first layer of the semiconductor structure. The semiconductor structure includes a dielectric structure disposed within a second layer of the semiconductor structure, with the second layer being disposed on the first layer. The semiconductor structure includes a second conductive structure disposed within a recessed portion of the dielectric structure that extends to the first conductive structure, with the second conductive structure having a concave recessed portion on a top surface of the second conductive structure. The semiconductor structure includes multiple layers of conductive material disposed within the concave recessed portion of the second conductive structure.

As described in greater detail above, some implementations described herein provide a semiconductor structure. The semiconductor structure includes a first wafer including a first dielectric structure that includes a first recessed portion having a first conductive structure disposed within the first recessed portion, with the first conductive structure including a first concave recessed portion on a top surface of the first conductive structure. The semiconductor structure includes a first conductive material disposed within the first concave recessed portion of the first conductive structure. The semiconductor structure also includes a second wafer including a second dielectric structure that includes a second recessed portion, with the second dielectric structure being bonded to the first dielectric structure. The semiconductor structure additionally includes a second conductive structure disposed within the second recessed portion, with the second conductive structure including a second concave recessed portion on a top surface of the second conductive structure. The semiconductor structure further includes a second conductive material disposed within the second concave recessed portion, with the second conductive material being bonded to the first conductive material.

As described in greater detail above, some implementations described herein provide a method of forming a semiconductor structure. The method of forming semiconductor structure includes depositing a conductive structure within a recessed portion of a dielectric structure. The method additionally includes polishing a top surface of the semiconductor structure, with the polishing forming a concave recessed portion on a top surface of the conductive structure. The method of forming semiconductor structure includes growing a conductive material within the concave recessed portion to form a substantially planar top surface for the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    a first conductive structure disposed within a first layer of the semiconductor structure;
    a dielectric structure disposed within a second layer of the semiconductor structure, the second layer being disposed on the first layer, wherein the dielectric structure comprises one or more of:
        a barrier layer on a bottom surface of the dielectric structure,
        a redistribution oxide layer, or
        a bonding dielectric layer on a top surface of the dielectric structure;
    a second conductive structure disposed within a recessed portion of the dielectric structure that extends to the first conductive structure, the second conductive structure having a concave recessed portion on a top surface of the second conductive structure; and
    multiple layers of conductive material disposed within the concave recessed portion of the second conductive structure.

2. The semiconductor structure of claim 1, wherein the bonding dielectric layer comprises:
    a heterostructure having nitrogen and hydrogen dopants.

3. The semiconductor structure of claim 1, wherein the second conductive structure comprises a copper interconnect.

4. The semiconductor structure of claim 1, wherein the multiple layers of conductive material comprise a carbon-based material.

5. The semiconductor structure of claim 1, wherein a top surface of the multiple layers of conductive material is generally planar with the top surface of the dielectric structure.

6. The semiconductor structure of claim 1, wherein the bonding dielectric layer includes one or more recessed portions, and
    wherein the semiconductor structure comprises silicon oxynitride material disposed within the one or more recessed portions of the bonding dielectric layer.

7. The semiconductor structure of claim 6, wherein the one or more recessed portions of the bonding dielectric layer are disposed adjacent to the second conductive structure.

8. The semiconductor structure of claim 1, wherein a first wafer of the semiconductor structure comprises the first conductive structure, the dielectric structure, the second conductive structure, and the multiple layers of conductive material, and
    wherein a second wafer comprises, at a top surface of the second wafer,
        an additional dielectric structure bonded to the dielectric structure of the first wafer; and
        a third conductive structure bonded to the multiple layers of conductive material of the first wafer.

9. The semiconductor structure of claim 8, wherein the third conductive structure comprises a metal structure having an additional concave recessed portion, and
    an additional conductive material disposed within the additional concave recessed portion.

10. The semiconductor structure of claim 9, wherein the additional conductive material comprises one or more of:
    multiple layers of the additional conductive material, or
    a metal nitride material.

11. The semiconductor structure of claim 8, wherein the third conductive structure of the second wafer and the multiple layers of conductive material of the first wafer comprise:
    a same conductive 2-dimensional (2D) layered material,
    a heterostructure conductive 2D layered material, or
    a metal nitride material.

12. The semiconductor structure of claim 1, wherein the second conductive structure comprises:
    one or more barrier layers comprising 2D layered materials.

13. A semiconductor structure comprising:
    a first wafer comprising:
        a first dielectric structure that includes a first recessed portion;
        a first conductive structure disposed within the first recessed portion, the first conductive structure including a first concave recessed portion on a top surface of the first conductive structure; and
        a first conductive material disposed within the first concave recessed portion of the first conductive structure; and a second wafer comprising:
   a second dielectric structure that includes a second recessed portion, the second dielectric structure being bonded to the first dielectric structure;
   a second conductive structure disposed within the second recessed portion, the second conductive structure including a second concave recessed portion on a top surface of the second conductive structure; and
   a second conductive material disposed within the second concave recessed portion, the second conductive material being bonded to the first conductive material, wherein one or more of the first conductive material or the second conductive material comprises one or more of:
     a 2-dimensional layered material, or
     a metal nitride material.

14. A method of forming a semiconductor structure, comprising:
   depositing a conductive structure within a recessed portion of a dielectric structure, wherein the dielectric structure comprises one or more of:
     a barrier layer on a bottom surface of the dielectric structure,
     a redistribution oxide layer, or
     a bonding dielectric layer on a top surface of the dielectric structure;
   polishing a top surface of the semiconductor structure, the polishing forming a concave recessed portion on a top surface of the conductive structure; and
   growing a conductive material within the concave recessed portion to form a substantially planar top surface for the semiconductor structure.

15. The method of claim 14, wherein growing the conductive material within the concave recessed portion comprises one or more of:
   depositing multiple 2-dimensional layers of the conductive material within the concave recessed portion, or
   growing a metal nitride material, within the concave recessed portion, via ionized metal vapor deposition.

16. The method of claim 14, wherein depositing the conductive structure, polishing the top surface of the semiconductor structure, and growing the conductive material form a first wafer,
wherein the method further comprises:
   forming a second wafer that comprises an additional dielectric structure and an additional conductive material at a bonding interface of the second wafer; and
   bonding the second wafer, at the bonding interface of the second wafer, to the first wafer at a top surface of the first wafer,
     wherein the conductive material is bonded to the additional conductive material and the dielectric structure is bonded to the additional dielectric structure.

17. The method of claim 16, wherein bonding the second wafer to the first wafer comprises:
   bonding the second wafer to the first wafer at a temperature in a range of approximately 15 degrees Celsius to approximately 25 degrees Celsius.

18. The method of claim 16, wherein the additional conductive material is grown, within an additional concave recessed portion of an additional conductive structure of the second wafer, via one or more of:
   depositing multiple 2-dimensional layers of the additional conductive material within the additional concave recessed portion, or
   growing an additional metal nitride material, within the concave recessed portion, via ionized metal vapor deposition.

19. The semiconductor structure of claim 1, wherein the multiple layers of conductive material comprise one or more of:
   a 2-dimensional layered material, or
   a metal nitride material.

20. The semiconductor structure of claim 13, wherein one or more of the first dielectric structure or the second dielectric structure comprise one or more of:
   a barrier layer on a bottom surface,
   a redistribution oxide layer, or
   a bonding dielectric layer on a top surface.

\* \* \* \* \*